US012684792B2

(12) United States Patent
Soneda et al.

(10) Patent No.: US 12,684,792 B2
(45) Date of Patent: Jul. 14, 2026

(54) SEMICONDUCTOR DEVICE COMPRISING A TRANSISTOR REGION AND A CAPACITANCE ADJUSTING REGION

(71) Applicant: Mitsubishi Electric Corporation, Tokyo (JP)

(72) Inventors: Shinya Soneda, Tokyo (JP); Kazuya Konishi, Tokyo (JP); Akihiko Furukawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 747 days.

(21) Appl. No.: 17/654,213

(22) Filed: Mar. 9, 2022

(65) Prior Publication Data

US 2022/0416064 A1     Dec. 29, 2022

(30) Foreign Application Priority Data

Jun. 25, 2021    (JP) ................................. 2021-105553

(51) Int. Cl.
   *H10D 12/00*      (2025.01)
   *H10D 62/10*      (2025.01)
   *H10D 84/80*      (2025.01)

(52) U.S. Cl.
   CPC ......... *H10D 12/481* (2025.01); *H10D 62/127* (2025.01); *H10D 84/811* (2025.01)

(58) Field of Classification Search
   CPC ............... H01L 29/7397; H01L 29/407; H01L 27/0727; H01L 29/66348; H01L 27/0629;
            (Continued)

(56) References Cited

U.S. PATENT DOCUMENTS 10,910,478 B1    2/2021   Xu
2007/0264782 A1   11/2007   Shenoy et al.
              (Continued)

FOREIGN PATENT DOCUMENTS

DE    11 2014 006 606      1/2017
DE    10 2020 107 277 A1    9/2021
JP       2013-201266 A    10/2013

OTHER PUBLICATIONS

Office Action issued in DE 10 2022 111 103.2; mailed by the German Patent and Trademark Office on May 5, 2026.

*Primary Examiner* — David Chen
(74) *Attorney, Agent, or Firm* — Studebaker Brackett PLLC

(57) ABSTRACT

A semiconductor device includes a capacitance adjusting region. The capacitance adjusting region includes a first semiconductor layer of a first conductivity type, a second semiconductor layer of a second conductivity type, and a plurality of control trench gates. The first semiconductor layer is provided as a surface layer at an upper surface of the semiconductor substrate. The second semiconductor layer is selectively provided at an upper surface of the first semiconductor layer. The second semiconductor layer contacts a side surface of each of the control trench gates. The first semiconductor layer and the second semiconductor layer are electrically connected to an emitter electrode of a transistor. A control trench electrode of at least one control trench gate is electrically connected to a gate electrode of the transistor.

11 Claims, 24 Drawing Sheets

(58) Field of Classification Search
CPC ............. H01L 29/7813; H01L 29/4236; H01L
29/0696; H01L 27/0664; H01L 29/7395;
H10D 12/481; H10D 62/127; H10D
84/811; H10D 64/117; H10D 84/813;
H10D 8/00; H10D 12/411
USPC ............... 257/139, 140, 301, 329, 330, 334,
257/E27.016, E29.197, E29.198, E29.262;
438/138, 270, 386
See application file for complete search history.

(56) References Cited

U.S. PATENT DOCUMENTS

| | | | | | |
|---|---|---|---|---|---|
| 2009/0242977 | A1* | 10/2009 | Kawaguchi | .......... | H10D 30/668 |
| | | | | | 257/330 |
| 2009/0278166 | A1* | 11/2009 | Soeno | ................ | H01L 29/7397 |
| | | | | | 257/133 |
| 2013/0248994 | A1 | 9/2013 | Ninomiya | | |
| 2016/0351561 | A1* | 12/2016 | Senoo | ................... | H01L 29/872 |
| 2016/0372585 | A1 | 12/2016 | Furukawa et al. | | |
| 2018/0323294 | A1* | 11/2018 | Okuda | ................ | H10D 62/127 |
| 2019/0181252 | A1* | 6/2019 | Shirakawa | .......... | H10D 62/177 |
| 2020/0381421 | A1* | 12/2020 | Suganuma | ............. | H02M 1/34 |
| 2021/0296479 | A1 | 9/2021 | Pfirsch et al. | | |

* cited by examiner

F I G   1
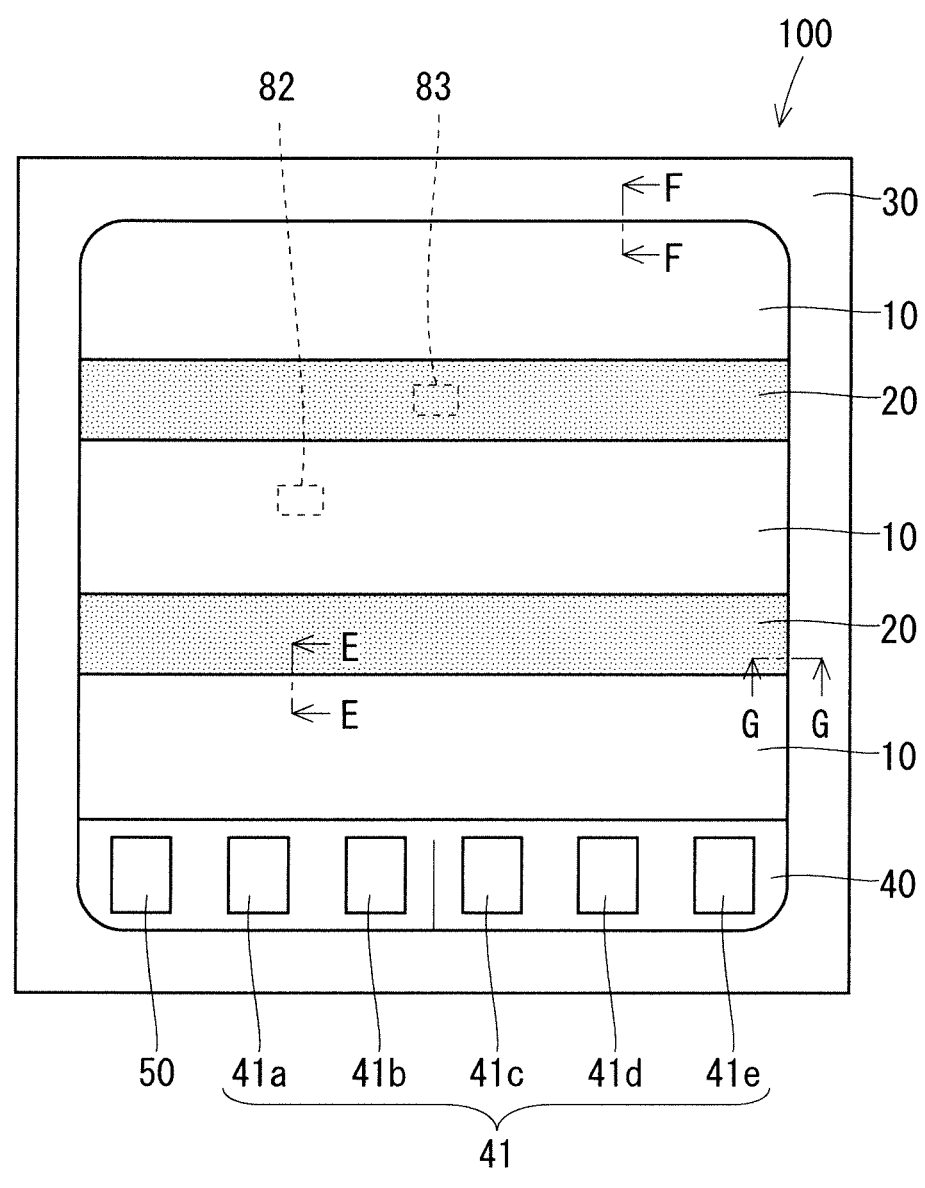

F I G 2
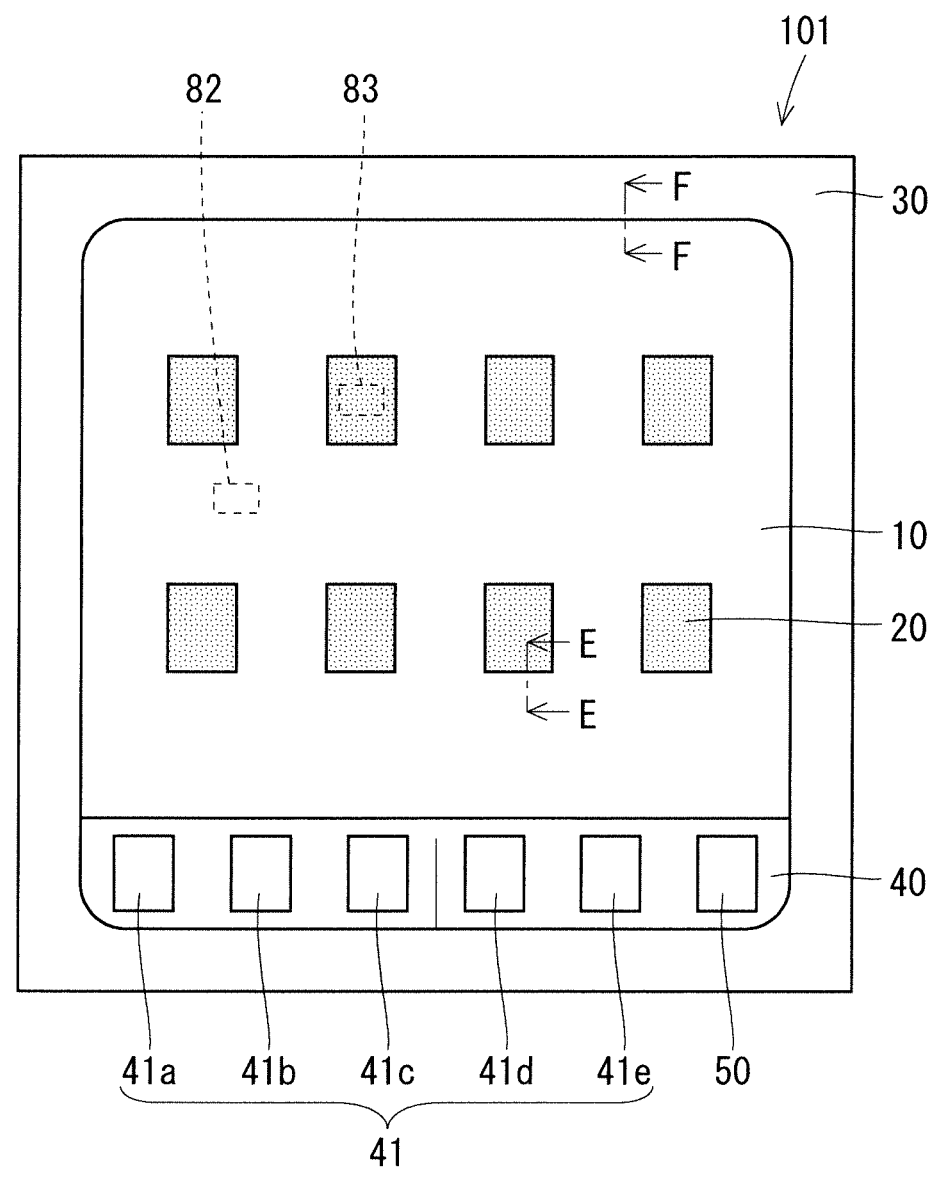

F I G 4
SECTION ALONG A-A
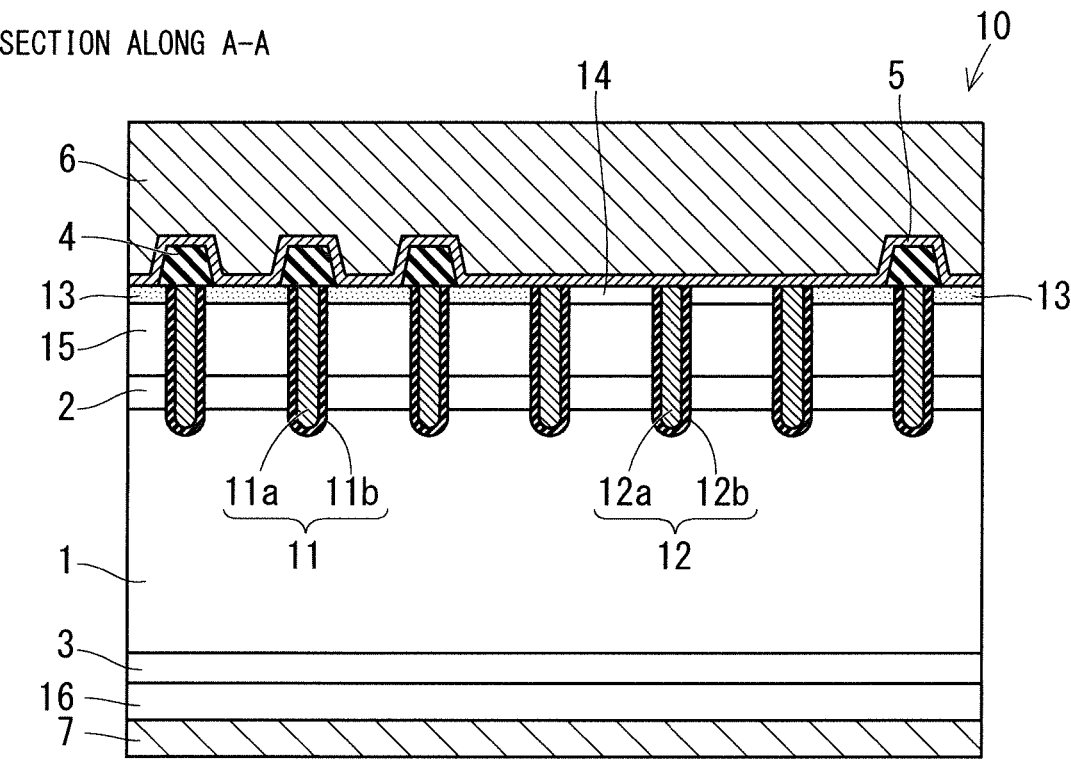

F I G   5
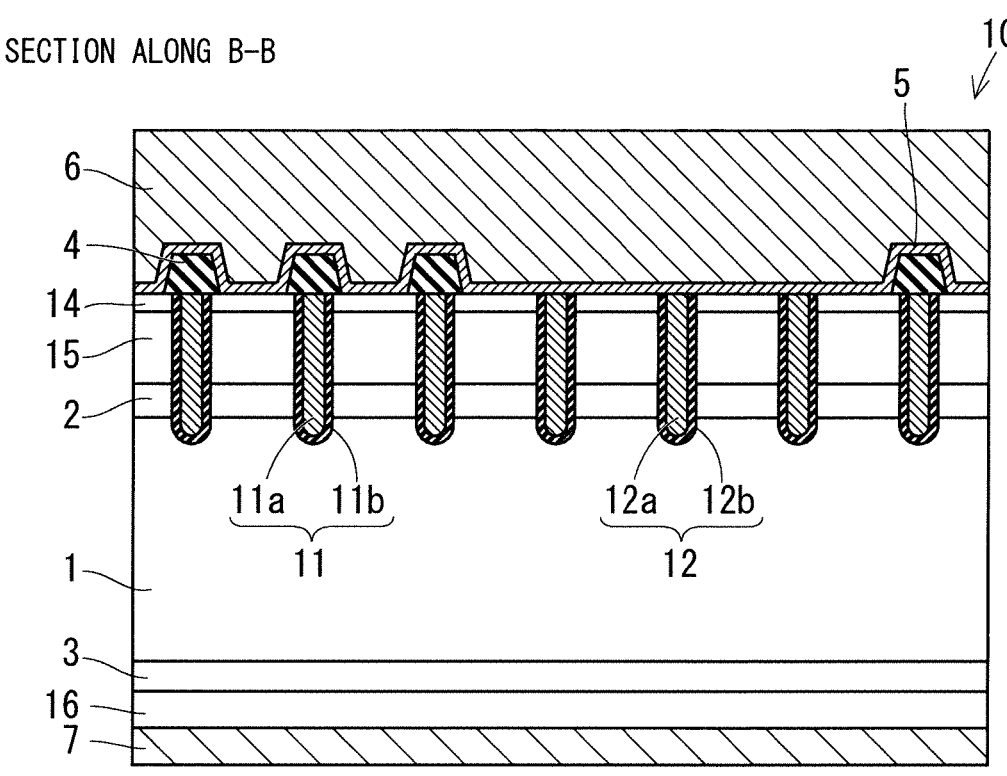

F I G. 6
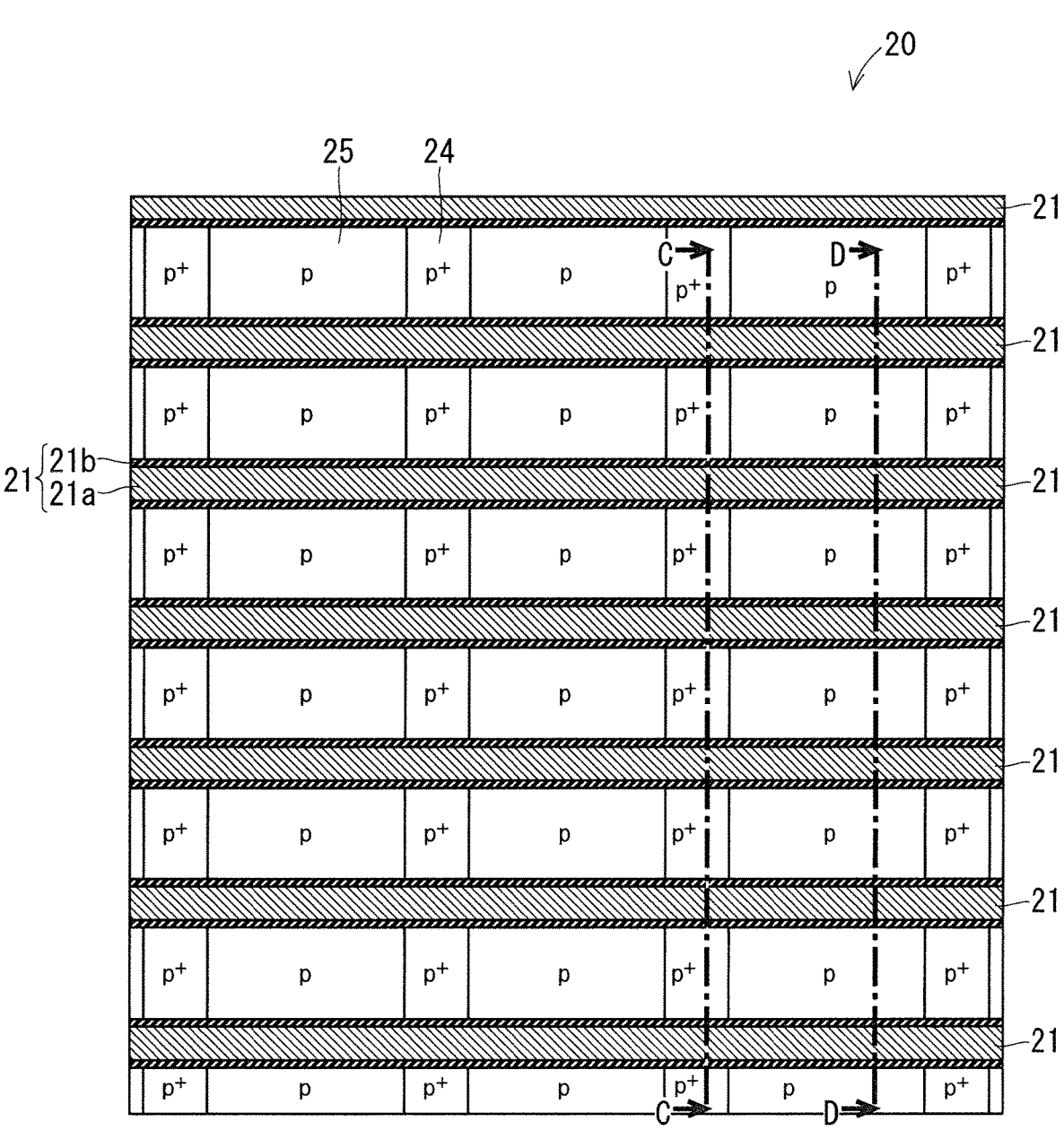

F I G. 7
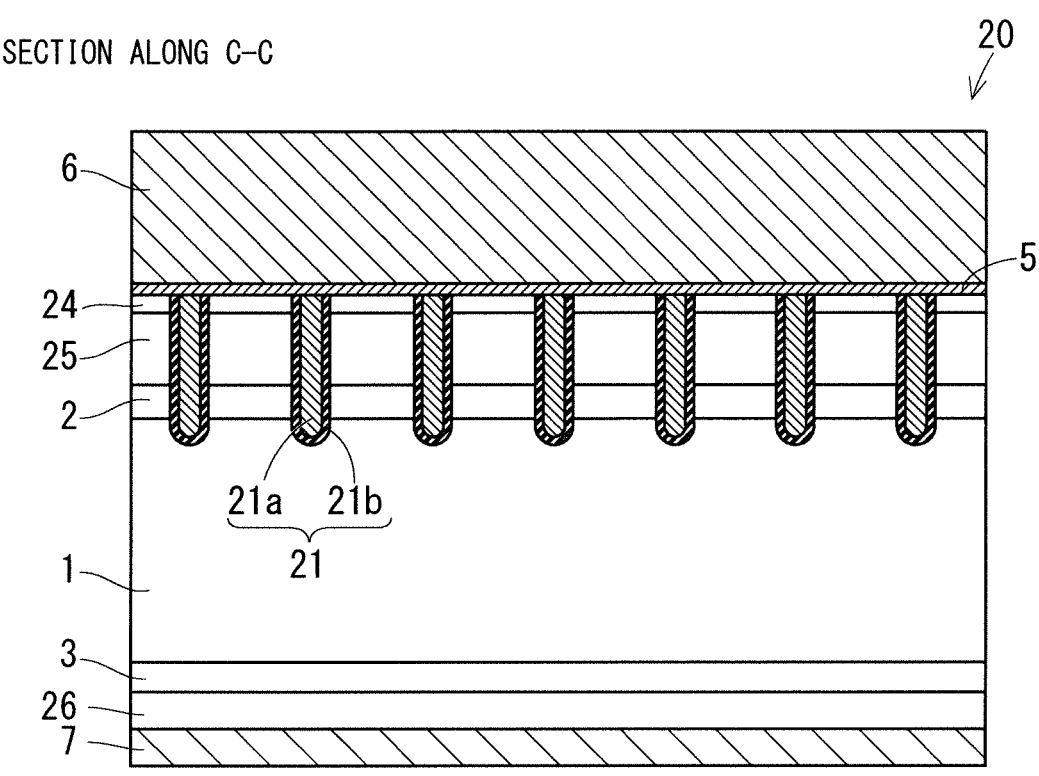

F I G   8
SECTION ALONG D-D
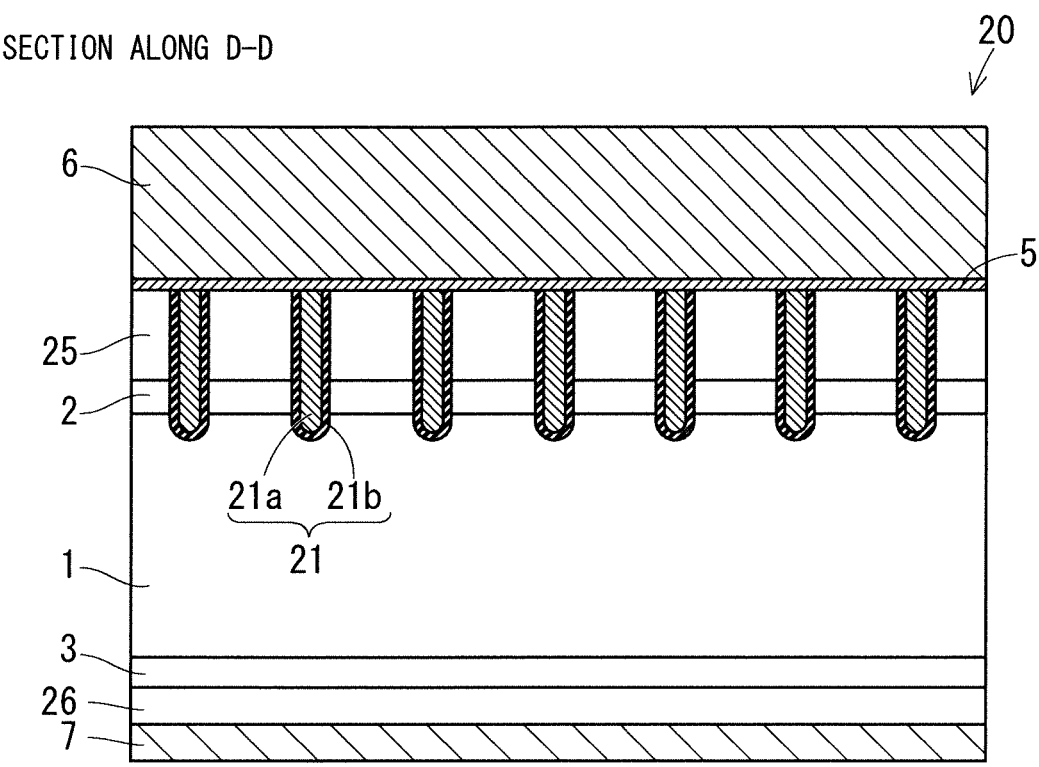

F I G   9
SECTION ALONG E-E
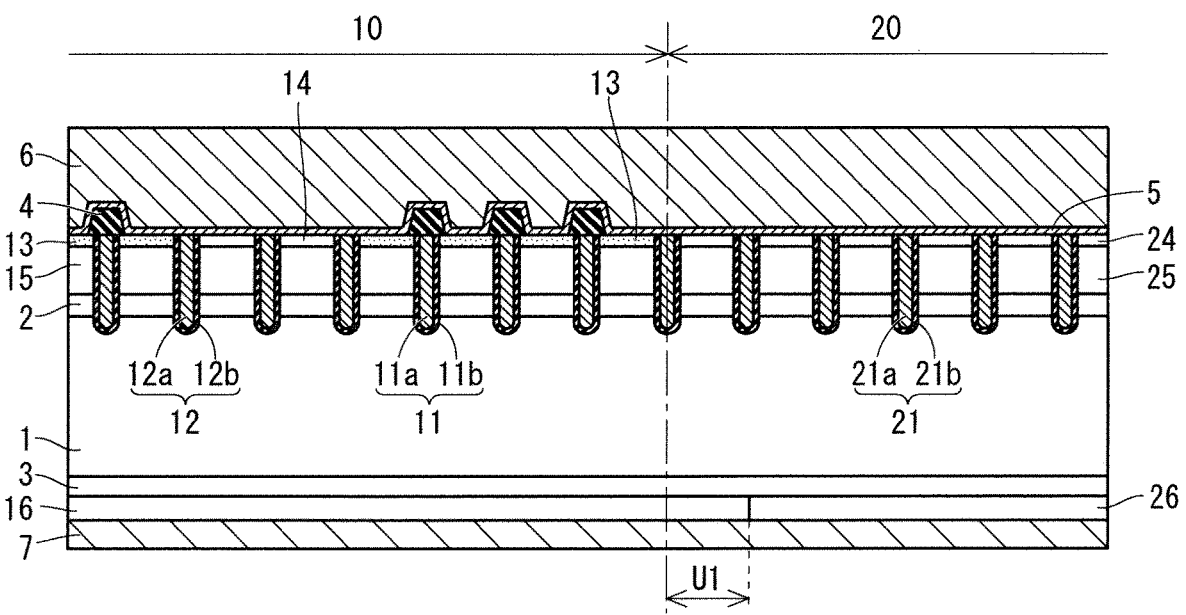

F I G. 1 0
SECTION ALONG F-F
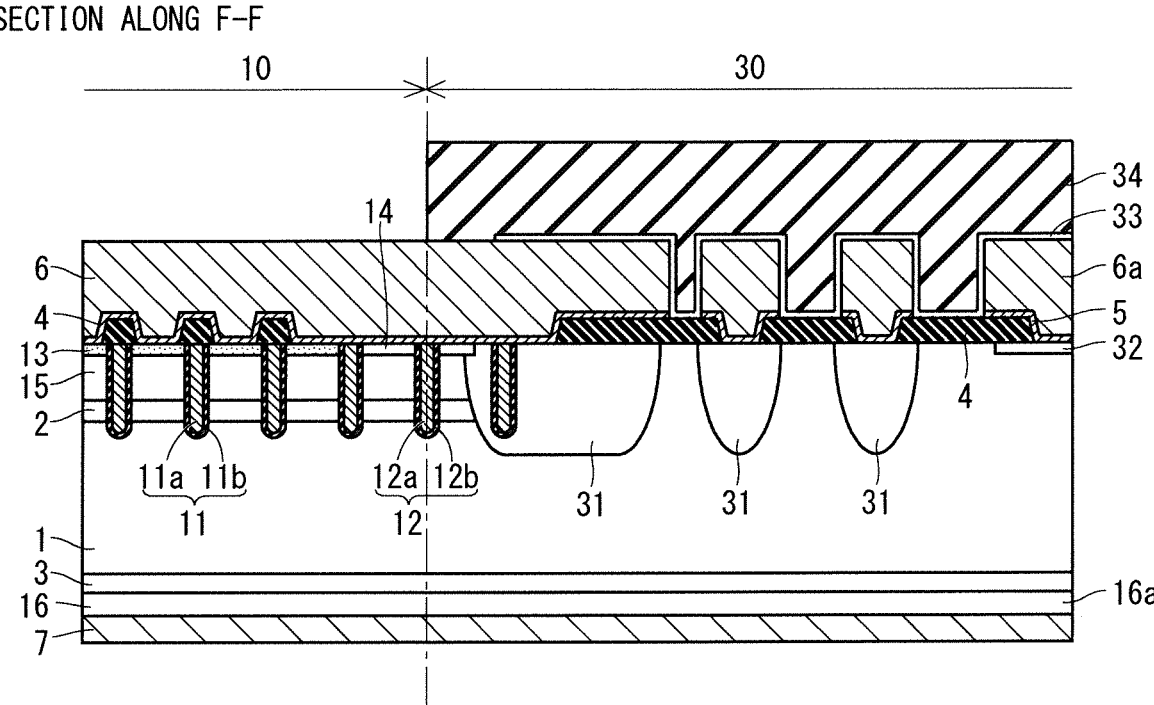

F I G   1 1
SECTION ALONG G-G
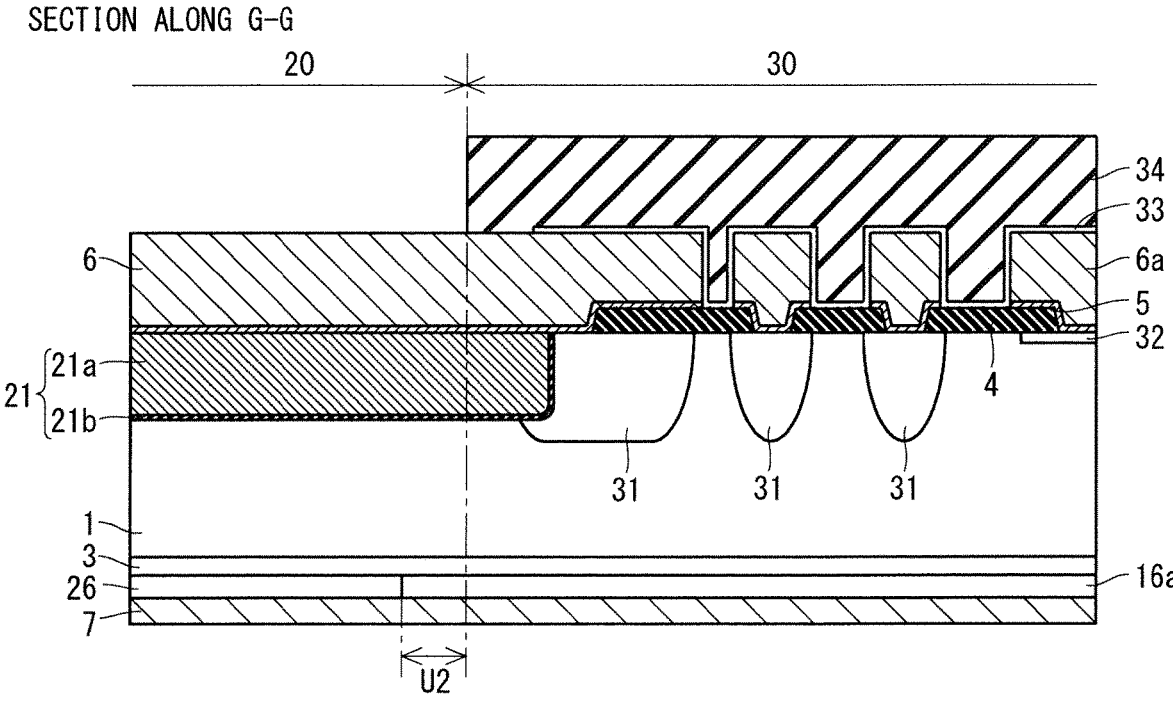

F I G .   1 3
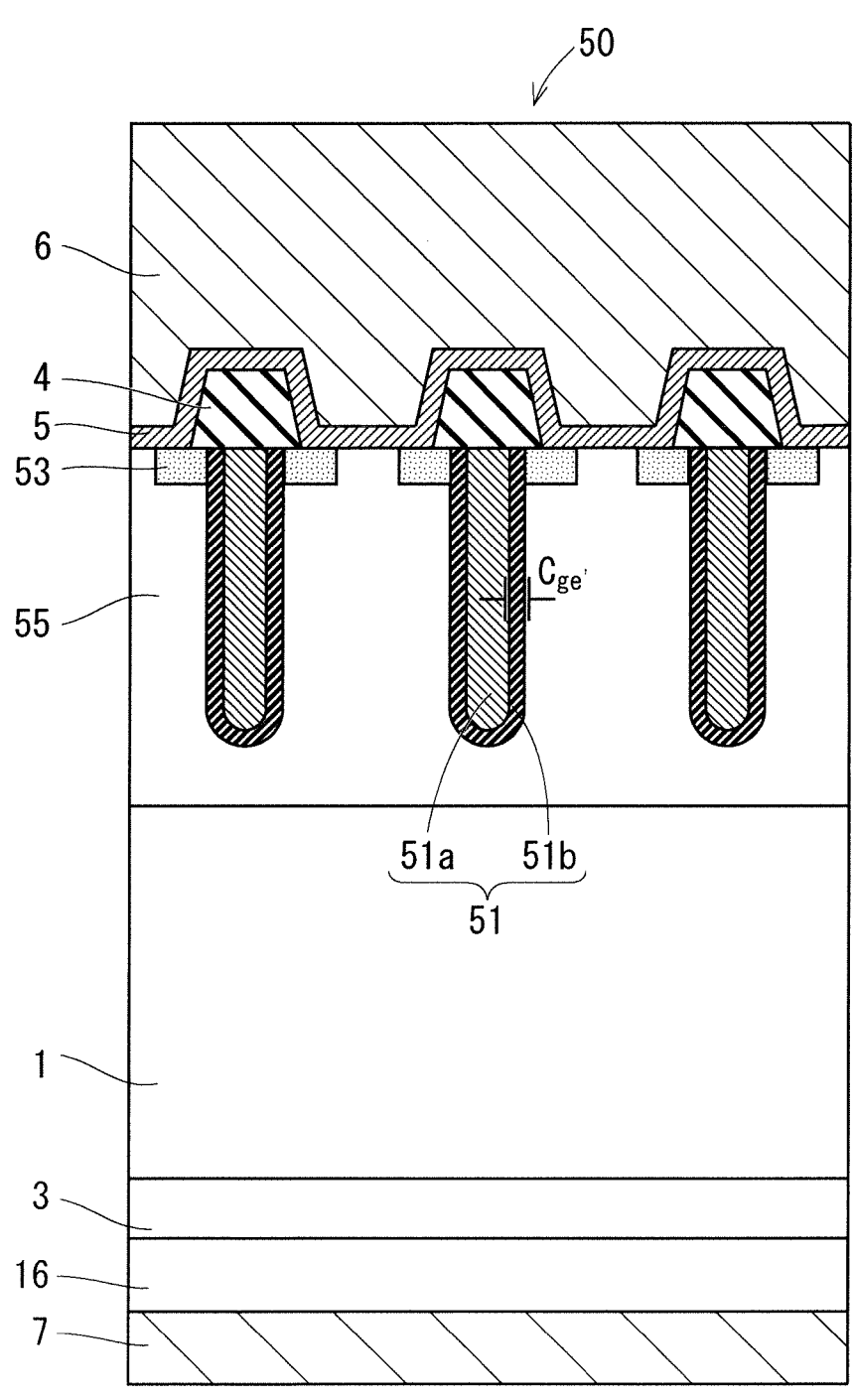

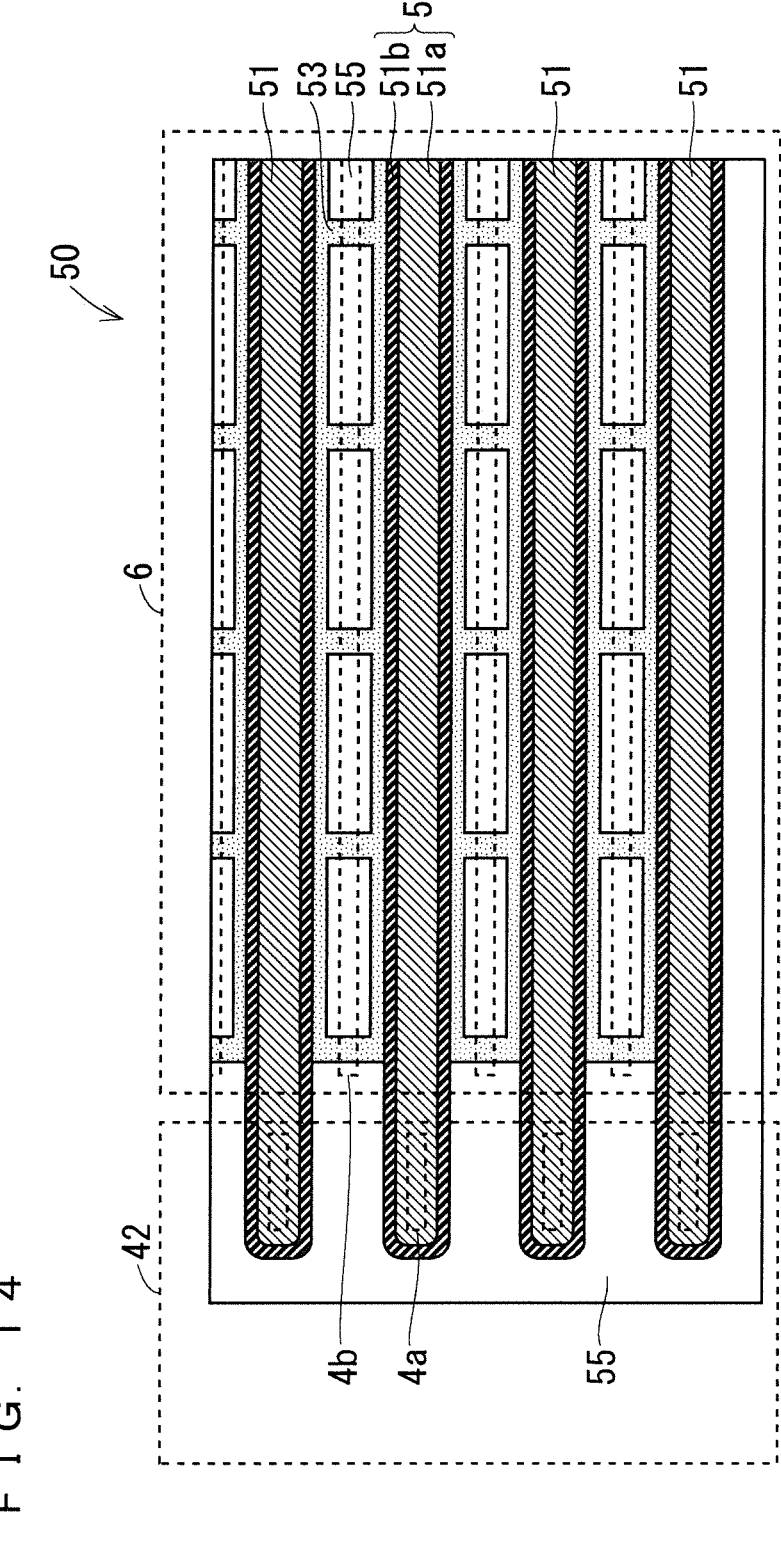
F I G. 1 4

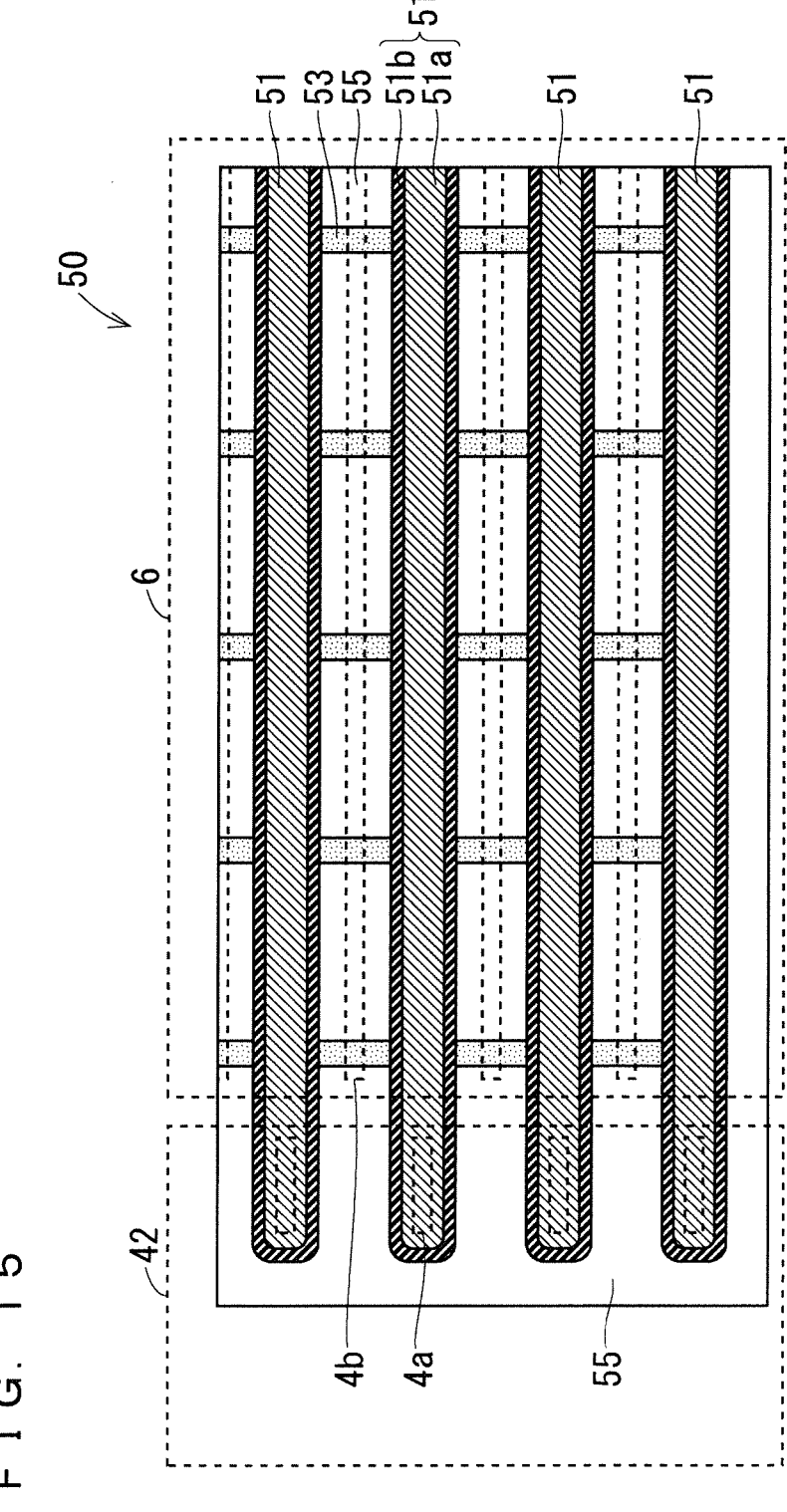
F I G. 1 5

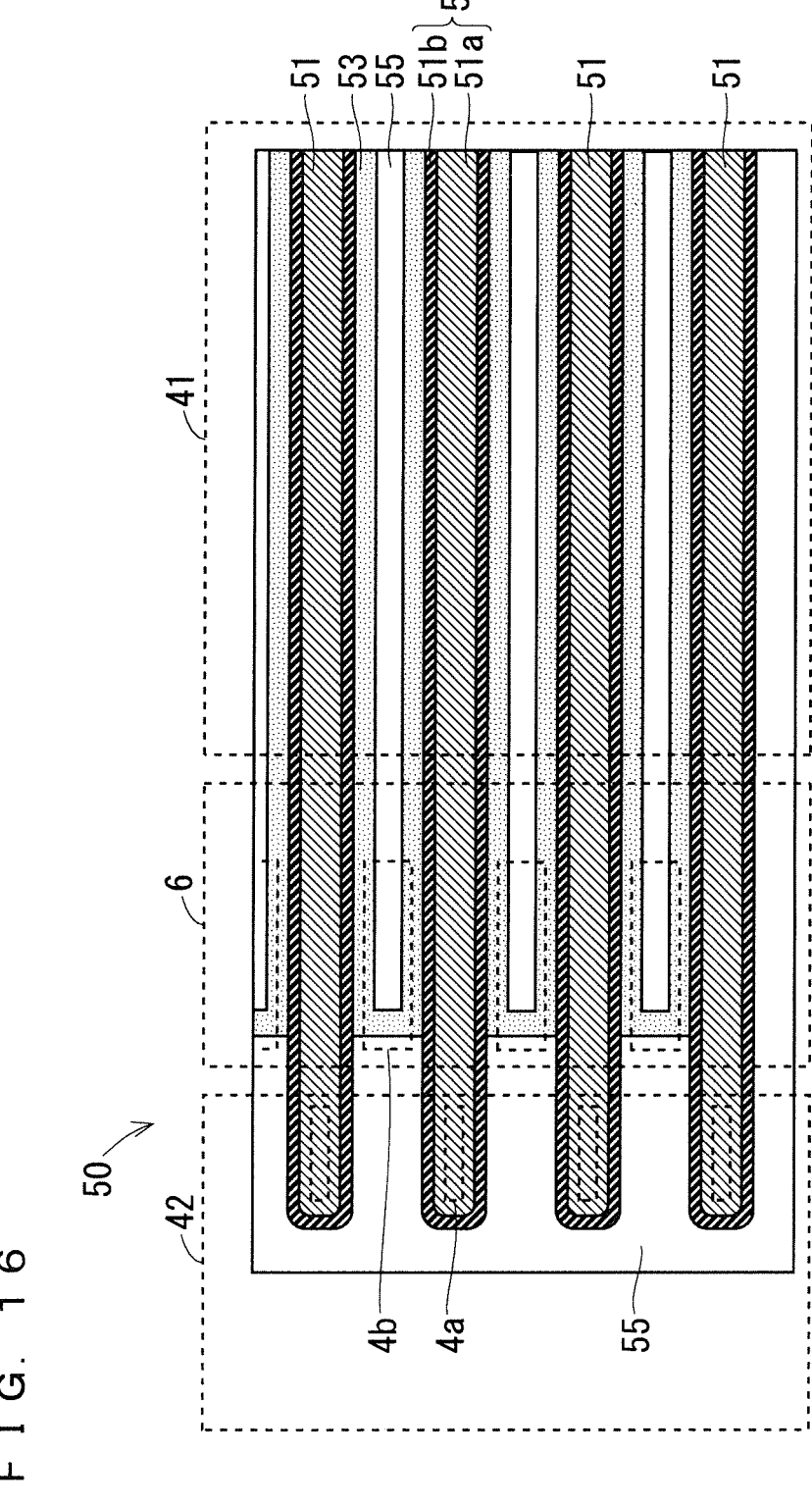
F I G. 1 6

F I G.  1 7
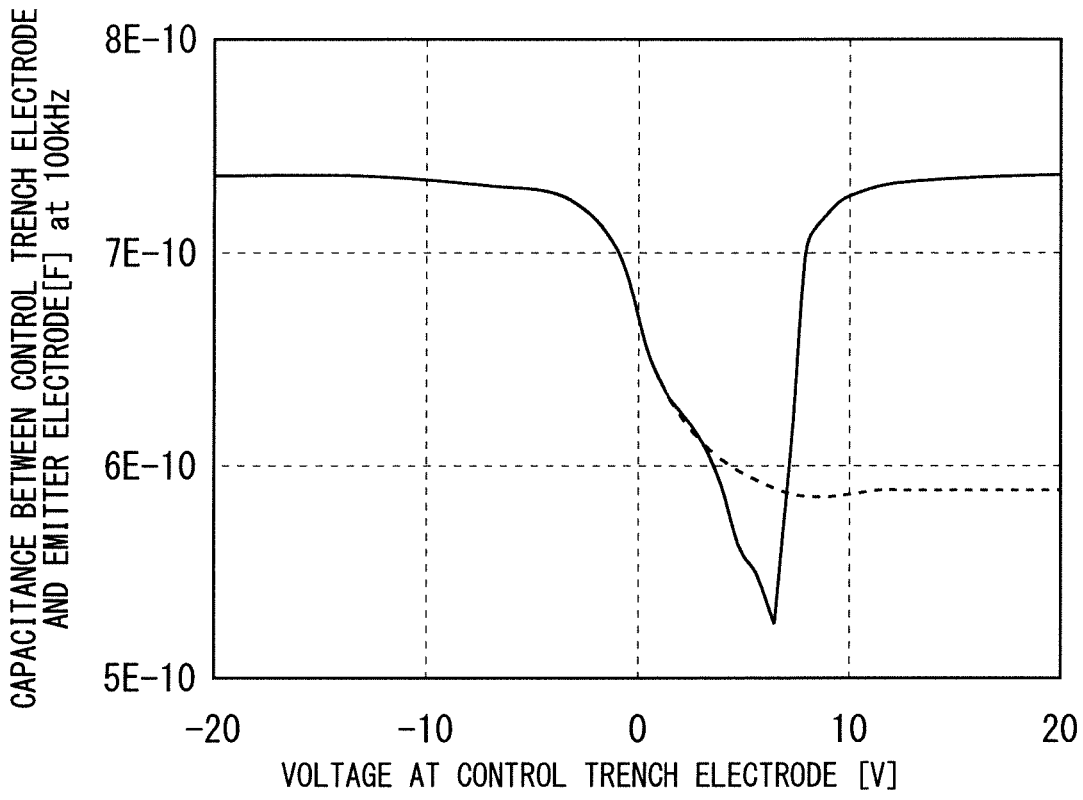

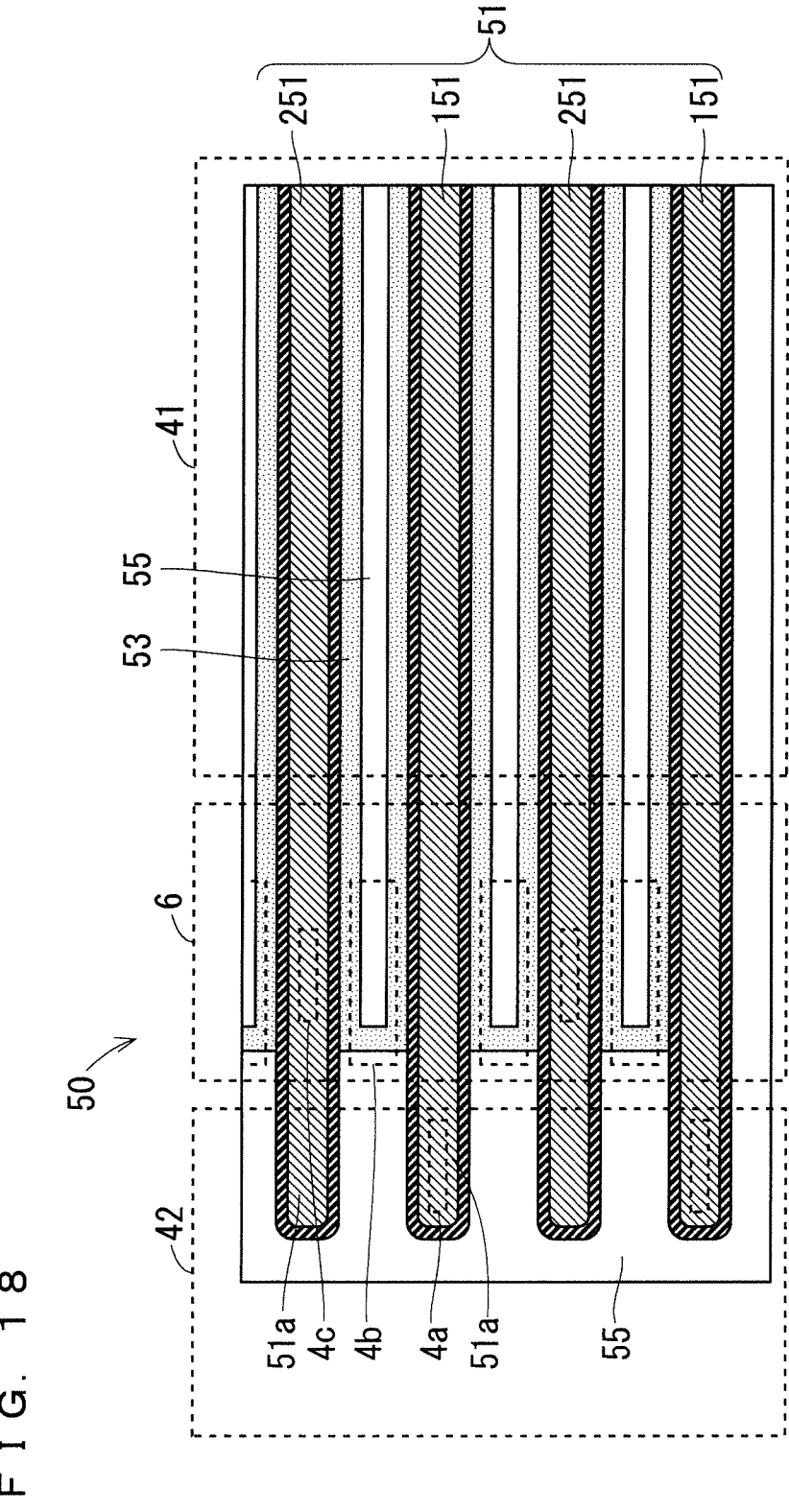
F I G. 1 8

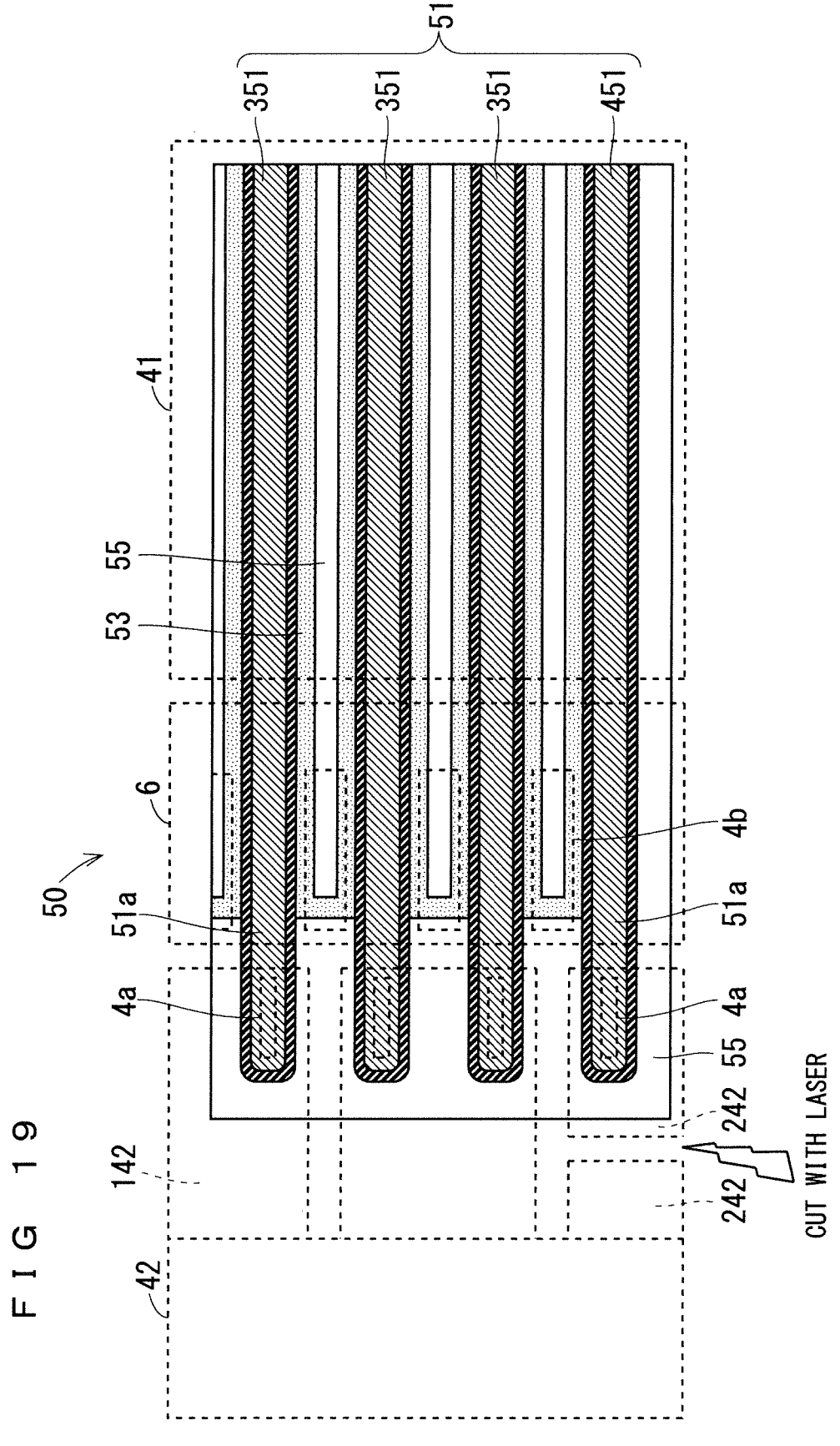
F I G 1 9

F I G. 2 0
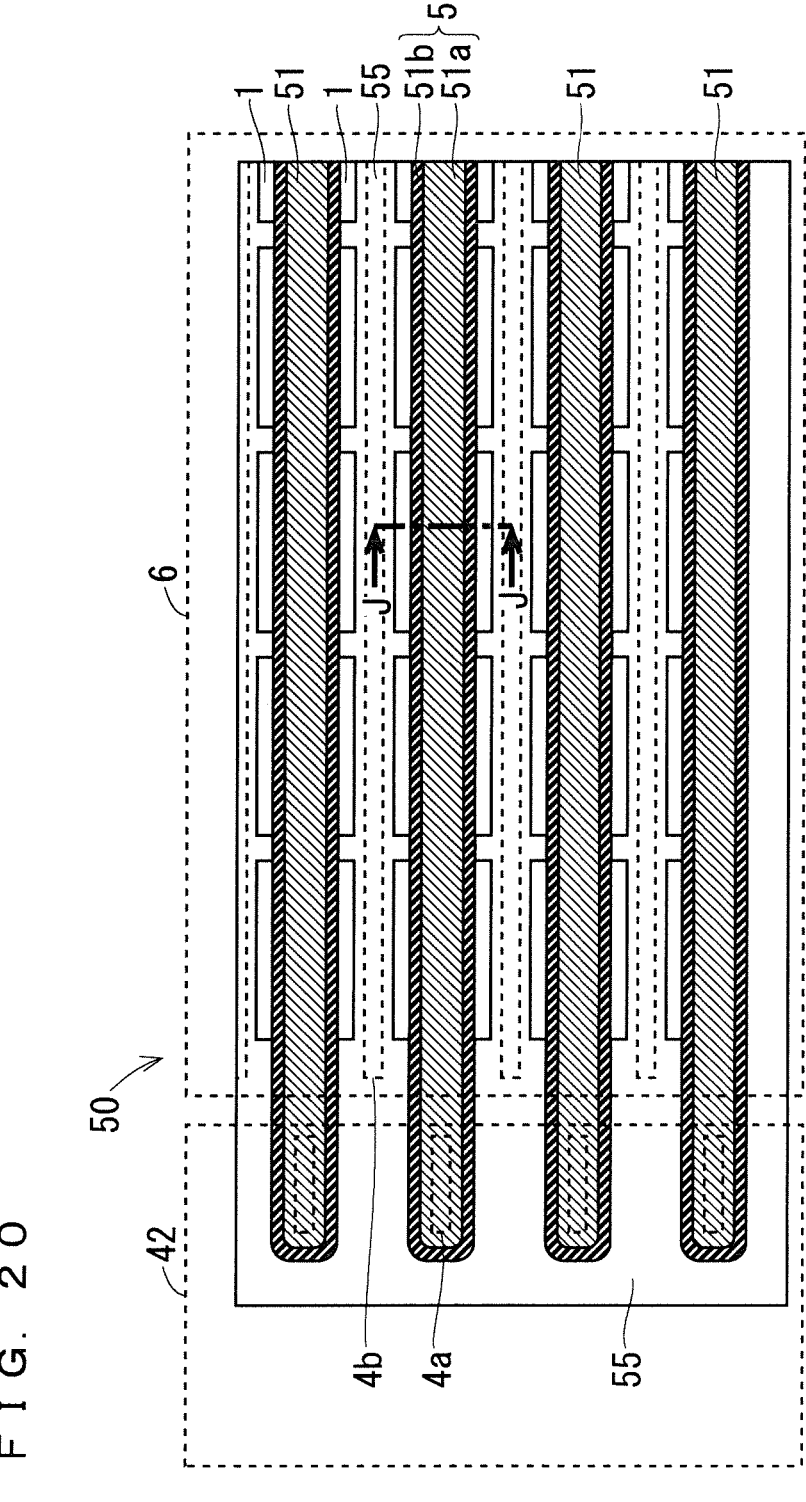

F I G.   2 1
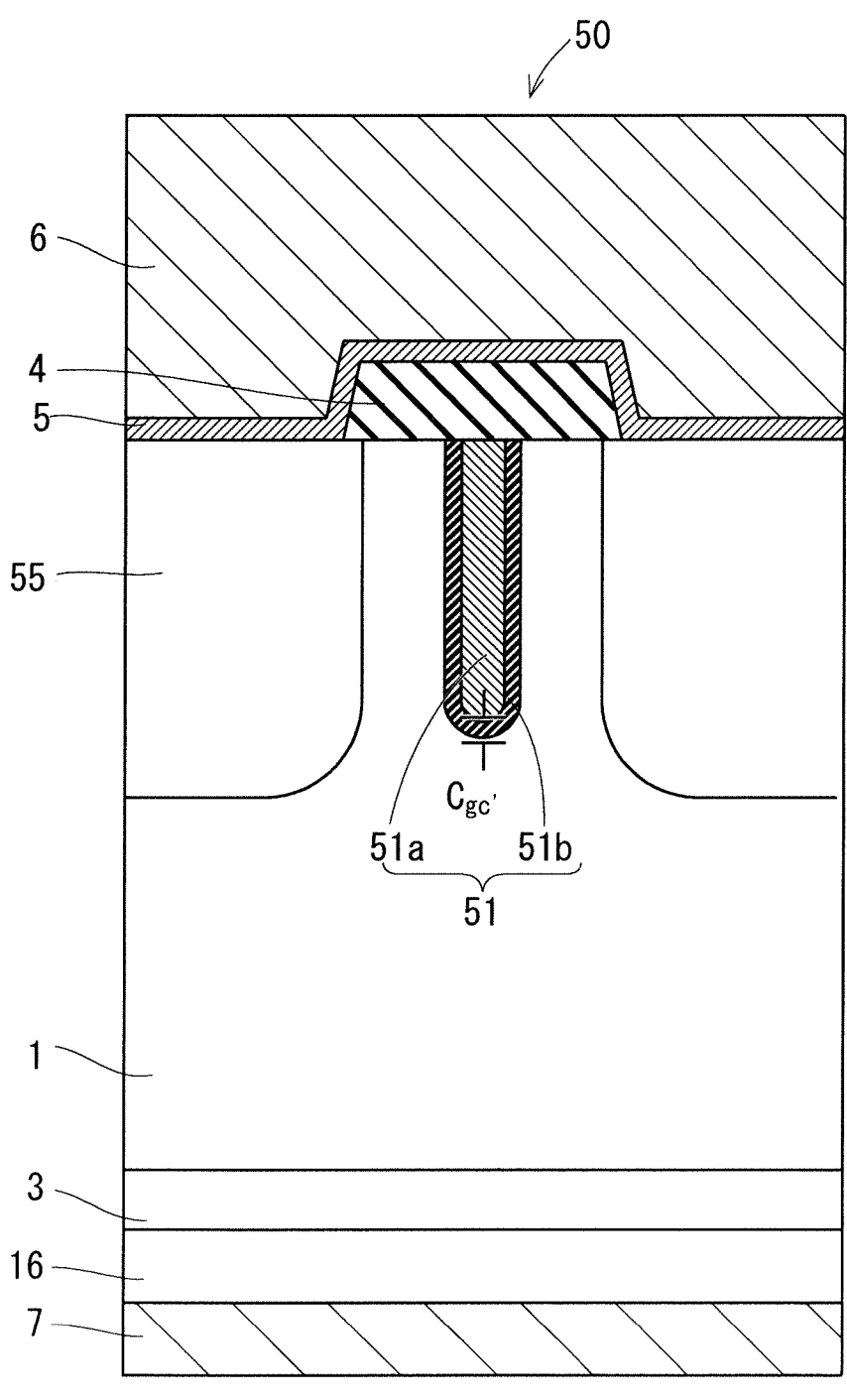

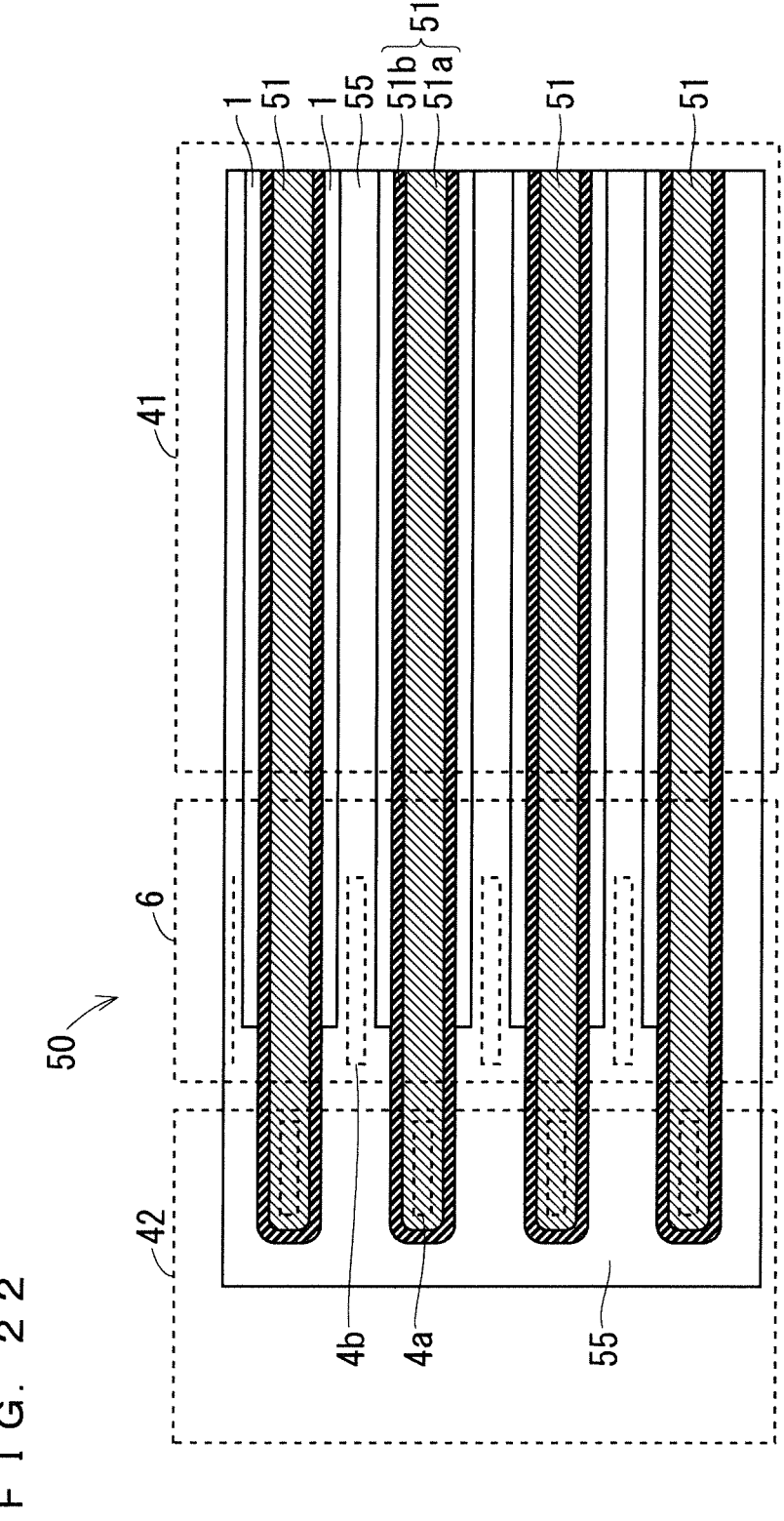
F I G. 2 2

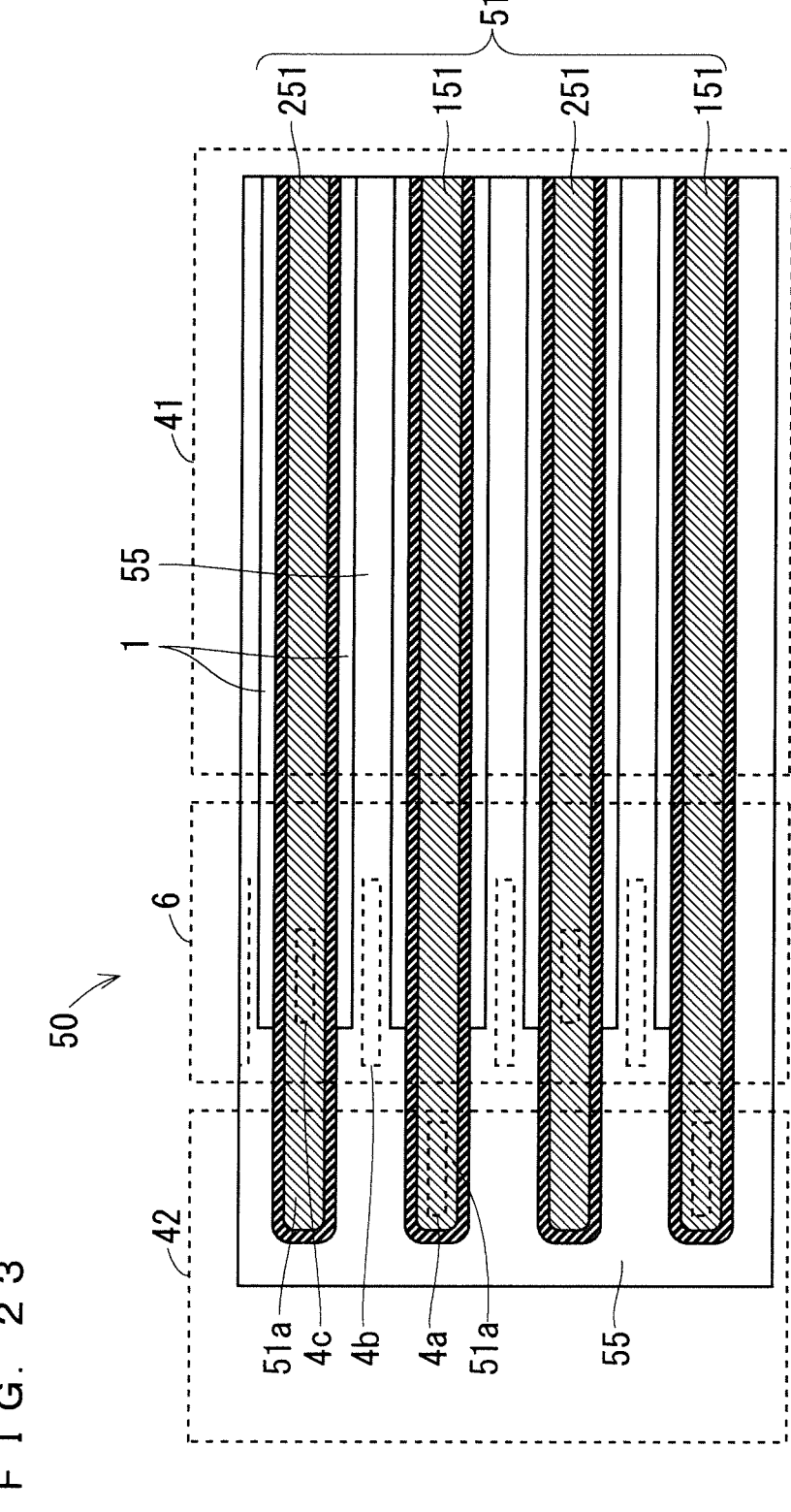
F I G. 2 3

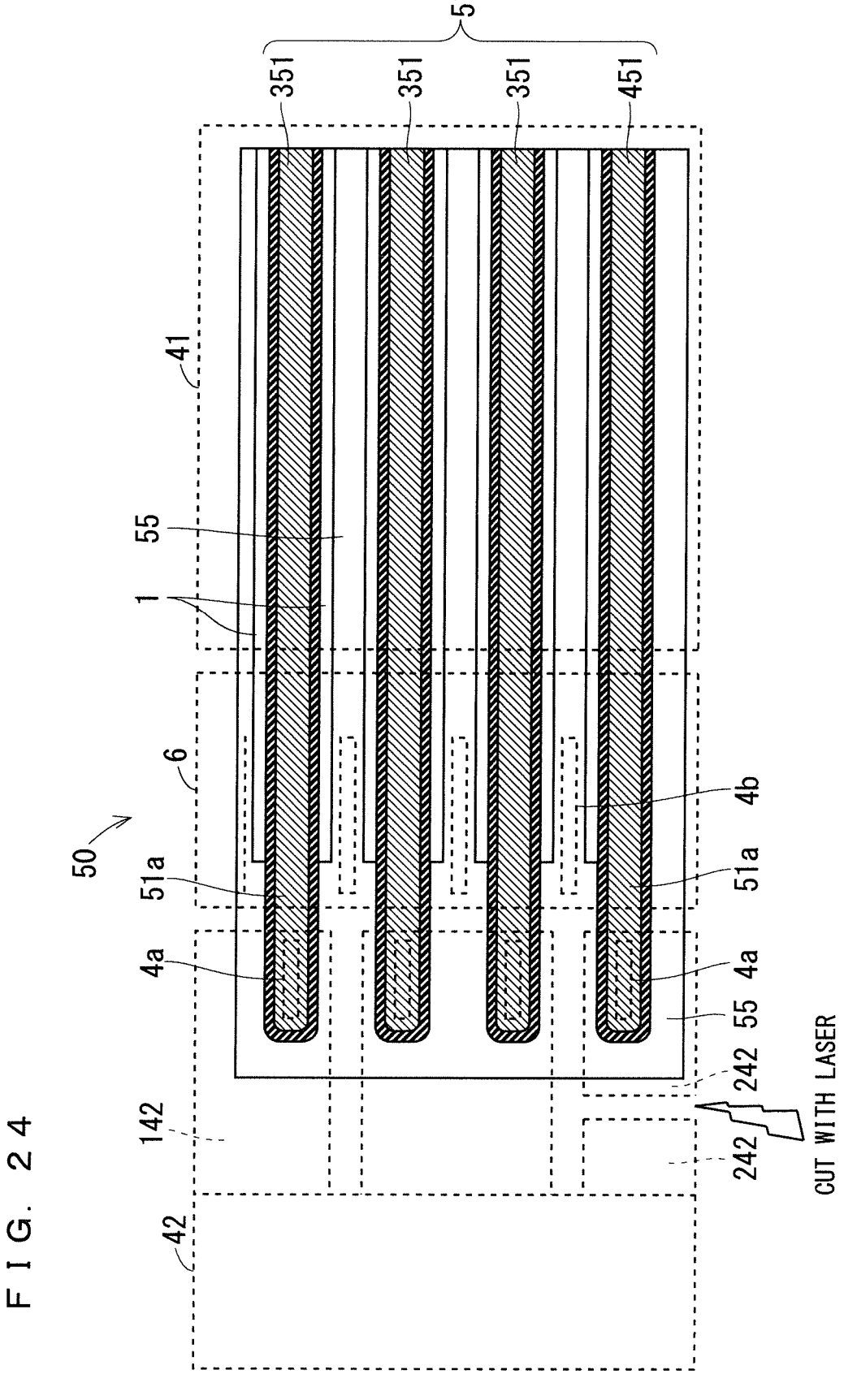
F I G. 2 4

SEMICONDUCTOR DEVICE COMPRISING A TRANSISTOR REGION AND A CAPACITANCE ADJUSTING REGION

BACKGROUND OF THE INVENTION

Field of the Invention

The present disclosure relates to a semiconductor device.

Description of the Background Art

In an insulated gate bipolar transistor (IGBT) driven by a gate having a trench-type metal oxide semiconductor (MOS) structure, an input capacitance and a feedback capacitance are formed at a trench gate during driving of the IGBT. The input capacitance corresponds to the sum (Cge+Cgc) of a gate-emitter capacitance (Cge) and a gate-collector capacitance (Cgc). The feedback capacitance corresponds to the gate-collector capacitance (Cgc). For the purpose of reducing switching loss in the IGBT, a ratio between these input capacitance and feedback capacitance is adjusted in response to purpose of use of the IGBT.

Japanese Patent Application Laid-Open No. 2013-201266 suggests a power semiconductor device in which a trench, a conductor, and an insulating film are arranged in a p-type semiconductor layer. In this power semiconductor device, a gate-emitter built-in capacitance is increased.

In a configuration such as that disclosed in Japanese Patent Application Laid-Open No. 2013-201266, due to bad frequency response of a built-in capacitance to be added, it is impossible to generate the built-in capacitance in such a manner as to follow the switching speed of the IGBT.

SUMMARY

To solve the above-described problem, the present disclosure is intended to provide a semiconductor device that improves the frequency response of an input capacitance and that of a feedback capacitance.

A semiconductor device according to the present disclosure includes a semiconductor substrate, a transistor region, and a capacitance adjusting region. The transistor region is provided in the semiconductor substrate and includes a transistor. The capacitance adjusting region is provided in the semiconductor substrate. The capacitance adjusting region includes: a first semiconductor layer of a first conductivity type, a second semiconductor layer of a second conductivity type, and a plurality of control trench gates. The first semiconductor layer is provided as a surface layer at an upper surface of the semiconductor substrate. The second semiconductor layer as the surface layer of the semiconductor substrate is selectively provided at an upper surface of the first semiconductor layer. Each of the control trench gates includes a control trench insulating film and a control trench electrode. The control trench insulating film is formed on an inner wall of a trench that penetrates the second semiconductor layer from the upper surface of the semiconductor substrate, and has a tip located in the first semiconductor layer. The control trench electrode is formed inside the trench across the control trench insulating film. The second semiconductor layer contacts a side surface of each of the control trench gates. The first semiconductor layer and the second semiconductor layer are electrically connected to an emitter electrode of the transistor. The control trench electrode of at least one control trench gate of the control trench gates is electrically connected to a gate electrode of the transistor.

A semiconductor device that improves the frequency response of an input capacitance and that of a feedback capacitance is provided.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIGS. 1 and 2 are plan views showing respective examples of the configuration of a semiconductor device according to a first preferred embodiment;

FIGS. 4 and 5 are sectional views each showing the configuration of the IGBT region in the semiconductor device according to the first preferred embodiment;

FIG. 6 is a partially enlarged plan view showing the configuration of a diode region in the semiconductor device according to the first preferred embodiment;

FIGS. 7 and 8 are sectional views each showing the configuration of the diode region in the semiconductor device according to the first preferred embodiment;

FIG. 9 is a sectional view showing the configuration of a boundary area between the IGBT region and the diode region;

FIG. 10 is a sectional view showing the configuration of a boundary area between the IGBT region and a terminal region;

FIG. 11 is a sectional view showing the configuration of a boundary area between the diode region and the terminal region;

FIG. 13 is a sectional view showing the configuration of the capacitance adjusting region in the semiconductor device according to the first preferred embodiment;

FIG. 14 is a plan view showing the configuration of a capacitance adjusting region according to a fourth modification of the first preferred embodiment;

FIG. 15 is a plan view showing the configuration of a capacitance adjusting region according to a fifth modification of the first preferred embodiment;

FIG. 16 is a plan view showing the configuration of a capacitance adjusting region according to a second preferred embodiment;

FIG. 17 shows a relationship between a voltage to be applied to a control trench electrode and an additive capacitance;

FIG. 18 is a plan view showing the configuration of a capacitance adjusting region according to a first modification of the second preferred embodiment;

FIG. 19 is a plan view showing the configuration of a capacitance adjusting region according to a second modification of the second preferred embodiment;

FIG. 20 is a plan view showing the configuration of a capacitance adjusting region according to a third preferred embodiment;

FIG. 21 is a sectional view showing the configuration of the capacitance adjusting region according to the third preferred embodiment;

FIG. 22 is a plan view showing the configuration of a capacitance adjusting region according to a first modification of the third preferred embodiment;

FIG. 23 is a plan view showing the configuration of a capacitance adjusting region according to a second modification of the third preferred embodiment; and FIG. 24 is a plan view showing the configuration of a capacitance adjusting region according to a third modification of the third preferred embodiment.

DESCRIPTION OF THE PREFERRED EMBODIMENTS

First Preferred Embodiment

Figure 3:
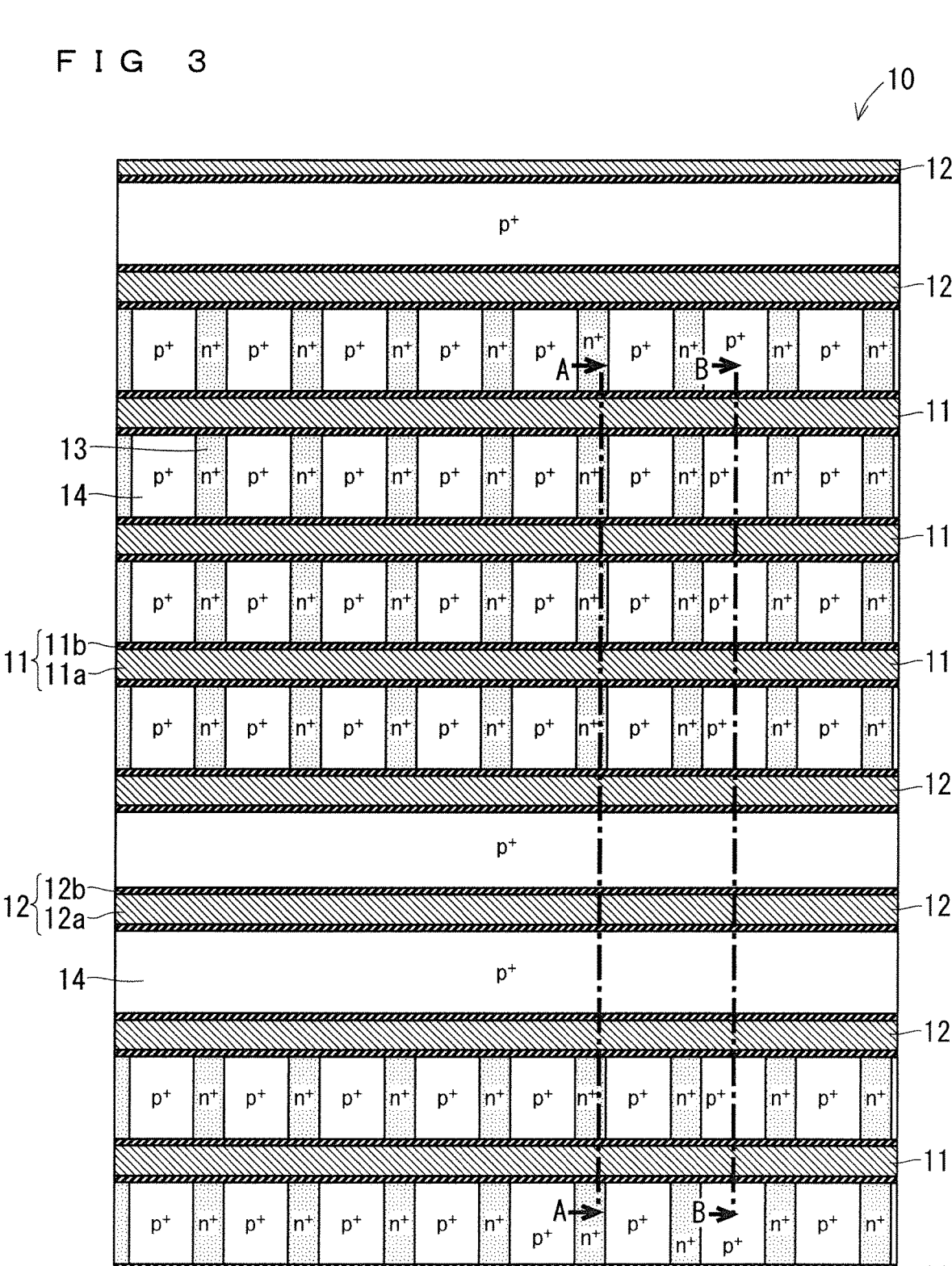
FIG. 3 is a partially enlarged plan view showing the configuration of an IGBT region in the semiconductor device according to the first preferred embodiment.

In the following description, n and p show conductivity types of semiconductor. A sign n⁻ means an impurity concentration lower than n. A sign n⁺ means an impurity concentration higher than n. Likewise, a sign p⁻ means an impurity concentration lower than p. A sign p⁺ means an impurity concentration higher than p. The p-type and the n-type in corresponding layers layer described below may be switched to each other.

(1) Overall Planar Configuration of Semiconductor Device

FIG. 1 is a plan view showing an example of the configuration of a semiconductor device 100 according to a first preferred embodiment. The semiconductor device 100 includes an insulated gate bipolar transistor (IGBT) region 10 and a diode region 20 provided in one semiconductor substrate. The diode region 20 is adjacent to the IGBT region 10. The IGBT region 10 includes a plurality of IGBT cell structures (IGBT cells) formed therein. The diode region 20 includes a plurality of free wheeling diode cell structures (diode cells) formed therein. The cell structure is a structure corresponding to a minimum unit of an element. A region including the IGBT region 10 and the diode region 20 is called a cell region. The semiconductor device 100 of the first preferred embodiment is a reverse conducting IGBT (RC-IGBT). The semiconductor substrate is made of semiconductor such as Si, or made of so-called wide bandgap semiconductor such as SiC, GaN, or gallium oxide, for example.

The IGBT region 10 and the diode region 20 each have a planar shape of a stripe pattern. The IGBT region 10 and the diode region 20 each extend in one direction in the plane of the semiconductor substrate. The IGBT region 10 and the diode region 20 are arranged side by side alternately in a direction perpendicular to the directions in which the IGBT region 10 and the diode region 20 extend. This semiconductor device 100 is called a "stripe-pattern" device.

FIG. 2 is a plan view showing an example of the configuration of a semiconductor device 101 according to the first preferred embodiment. Like the semiconductor device 100, the semiconductor device 101 is an RC-IGBT including the IGBT region 10 and the diode region 20 provided in one semiconductor substrate.

The diode region 20 has a planar shape of an island pattern. Here, the diode region 20 includes a plurality of diode regions 20 arranged in a vertical direction and a lateral direction within the plane of the semiconductor substrate. The IGBT region 10 surrounds each of the diode regions 20. This semiconductor device 101 is called an "island pattern" device.

The semiconductor 100 and the semiconductor device 101 each include a terminal region 30, a pad region 40, and a capacitance adjusting region 50, in addition to the IGBT region 10 and the diode region 20.

The pad region 40 is provided external to the cell region, namely, external to the IGBT region 10 and the diode region 20. Here, the pad region 40 is provided adjacent to the IGBT region 10. The pad region 40 is a region where a control pad 41 for controlling the semiconductor device is provided. In other words, the control pad 41 is a signal pad for detecting or controlling a state of the semiconductor substrate. The control pad 41 includes a current sense pad 41a, a kelvin emitter pad 41b, a gate pad 41c, and a temperature sense diode pad 41d and a temperature sense diode pad 41e, for example.

The current sense pad 41a is a control pad for sensing a current flowing in the cell region. The current sense pad 41a is electrically connected to some of the IGBT cells or diode cells in the cell region in such a manner as to cause a current to flow in the current sense pad 41a in a range from a fraction of a current flowing in the cell region entirely to 1/tens of thousands of the current.

The kelvin emitter pad 41b and the gate pad 41c are control pads to which a gate driving voltage for controlling on-off of the semiconductor device is to be applied. The kelvin emitter pad 41b is electrically connected to a p-type base layer and to an n⁺-type source layer (not shown in the drawings) of the IGBT cell. The kelvin emitter pad 41b and the p-type base layer may electrically be connected to each other through a p⁺-type contact layer (not shown in the drawings). The gate pad 41c is electrically connected to a gate trench electrode (not shown in the drawings) of the IGBT cell.

The temperature sense diode pads 41d and 41e are control pads electrically connected to an anode and a cathode of a temperature sense diode respectively (not shown in the drawings) provided in the cell region. The temperature sense diode pads 41d and 41e measure the temperature of the semiconductor device by measuring a voltage between the anode and the cathode of the temperature sense diode.

The capacitance adjusting region 50 has the function of forming a capacitance to be applied between the gate and the emitter or between the gate and the collector of the IGBT. In FIGS. 1 and 2, the capacitance adjusting region 50 is arranged in the pad region 40. As long as the capacitance adjusting region 50 is within a region surrounded by the terminal region 30, it may be arranged in another region such as an end portion of the IGBT region 10.

The terminal region 30 is provided in such a manner as to surround a region covering the cell region and the pad region 40. The terminal region 30 has a structure for retaining the breakdown voltage of the semiconductor device. Various structures are selected appropriately for the breakdown voltage retaining structure. For example, the breakdown voltage retaining structure is a field limiting ring (FLR) or a variation of lateral doping (VLD) formed in a surface layer at a first main surface (upper surface) of the semiconductor substrate. The FLR includes a p-type terminal well layer (not shown in the drawings) provided in such a manner as to surround the cell region. The VLD includes a p-type well layer (not shown in the drawings) provided in such a manner as to surround the cell region, and having a concentration gradient. The number of ring-like p-type terminal well layers 31 forming the FLR and a concentration distribution in the p-type well layer forming the VLD are selected appropriately in designing the breakdown voltage of the semiconductor device. The pad region 40 may be provided with a p-type terminal well layer extending substantially entirely over the pad region 40. In another case, the pad region 40 may be provided with an IGBT cell or a diode cell.

FIG. 1 shows three IGBT regions 10 and two diode regions 20. However, the number of the IGBT regions 10 and that of the diode regions 20 are not limited to these. The number of the IGBT regions 10 may be four or more, or two or less. The number of the diode regions 20 may be three or more, or one. In FIG. 1, one diode region 20 is sandwiched between two IGBT regions 10. However, the arrangements of the IGBT region 10 and the diode region 20 are not limited to this. The semiconductor device 100 may have a configuration in which the arrangements of the IGBT region 10 and the diode region 20 shown in FIG. 1 are switched to each other. Specifically, one IGBT region 10 may be sand-wiched between two diode regions 20. Alternatively, the IGBT regions 10 and the diode regions 20 of the same number may be provided adjacent to each other.

In FIG. 2, the diode regions 20 are arranged in a matrix with four columns in the right-left direction and two rows in the top-bottom direction. However, the number and arrange-ment of the diode regions 20 are not limited to these. The semiconductor device 101 may have a configuration in which at least one diode region 20 is provided like a dot in the IGBT region 10. The diode region 20 is only required to be arranged in such a manner that the periphery of the diode region 20 is surrounded by the IGBT region 10.

(2) Configuration of IGBT Region 10

FIG. 3 is a partially enlarged plan view showing the configuration of the IGBT region 10 in the semiconductor device 100 or 101 according to the first preferred embodi-ment. FIG. 3 shows a region 82 in an enlarged manner defined in the semiconductor device 100 in FIG. 1 or in the semiconductor device 101 in FIG. 2.

The semiconductor device 100 and the semiconductor device 101 each include an active trench gate 11 and a dummy trench gate 12 provided in the IGBT region 10.

In the semiconductor device 100, the active trench gate 11 and the dummy trench gate 12 each extend in a lengthwise direction of the IGBT region 10. In other words, the active trench gate 11 and the dummy trench gate 12 in the semi-conductor device 100 each have a length defined in a direction in which the IGBT region 10 extends. The length-wise direction of the IGBT region 10 corresponds to the right-left direction in FIG. 3.

In the semiconductor device 101, the active trench gate 11 and the dummy trench gate 12 each extend in one direction. For example, the active trench gate 11 and the dummy trench gate 12 each extend in one of the top-bottom direction and the right-left direction in FIG. 2.

The active trench gate 11 includes a gate trench insulating film 11b and a gate trench electrode 11a. While a sectional structure of the active trench gate 11 will be described later in detail, the gate trench insulating film 11b is formed along an inner wall of a trench formed in a depth direction from a first main surface (upper surface) of the semiconductor substrate. The gate trench electrode 11a is formed inside the trench across the gate trench insulating film 11b. The gate trench electrode 11a is electrically connected to the gate pad 41c (not shown in the drawings).

The dummy trench gate 12 includes a dummy trench insulating film 12b and a dummy trench electrode 12a. While a sectional structure of the dummy trench gate 12 will be described later in detail, the dummy trench insulating film 12b is formed along an inner wall of a trench formed in the depth direction from the first main surface of the semicon-ductor substrate. The dummy trench electrode 12a is formed inside the trench across the dummy trench insulating film 12b. The dummy trench electrode 12a is electrically con-nected to an emitter electrode 6 (not shown in FIG. 3, see FIG. 4) provided over a first main surface of the semicon-ductor device 100 or the semiconductor device 101.

In a part of the IGBT region 10 where the active trench gate 11 is provided, an n$^+$-type source layer 13 and a p$^+$-type contact layer 14 are formed selectively as a surface layer at the first main surface of the semiconductor substrate. In the first preferred embodiment, the n$^+$-type source layer 13 and the p$^+$-type contact layer 14 are provided alternately in a direction in which the active trench gate 11 extends (length-wise direction thereof). The active trench gate 11 is provided in such a manner as to cross these n$^+$-type source layer 13 and p$^+$-type contact layer 14. On both sides of the active trench gate 11 (as viewed in a direction perpendicular to the direction in which the active trench gate 11 extends), the n$^+$-type source layer 13 contacts the gate trench insulating film 11b. The n$^+$-type source layer 13 and the p$^+$-type contact layer 14 will be described later in detail.

In a part of the IGBT region 10 where the dummy trench gate 12 is provided, the p$^+$-type contact layer 14 is provided as a surface layer at the first main surface of the semicon-ductor substrate. The p$^+$-type contact layer 14 is provided between two dummy trench gates 12 adjacent to each other.

In FIG. 3, three dummy trench gates 12 are arranged next to three active trench gates 11. Other three active trench gates 11 are arranged next to these three dummy trench gates 12 (in FIG. 3, the lowest one of the three active trench gates 11 is omitted). Specifically, an active trench gate group including three active trench gates 11 as a set and a dummy trench gate group including three dummy trench gates 12 as a set are arranged alternately. The number of the active trench gates 11 belonging to one active trench gate group is not limited to three but may be one or more. The number of the dummy trench gates 12 belonging to one dummy trench gate group is not limited to three but may be one or more. In the semiconductor device 100 and the semiconductor device 101, the dummy trench gate 12 is not indispensable. Specifically, all trench gates in the IGBT region 10 may be the active trench gates 11.

FIG. 4 is a sectional view showing the configuration of the IGBT region 10 in the semiconductor device 100 or 101 according to the first preferred embodiment. FIG. 4 shows a section taken along a line segment A-A in FIG. 3.

In the IGBT region 10, the semiconductor device 100 and the semiconductor device 101 each include the n$^+$-type source layer 13, the p$^+$-type contact layer 14, a p-type base layer 15, an n-type carrier accumulation layer 2, an n$^-$-type drift layer 1, an n-type buffer layer 3, a p-type collector layer 16, the active trench gate 11, the dummy trench gate 12, an interlayer insulating film 4, a barrier metal 5, the emitter electrode 6, and a collector electrode 7.

One IGBT cell corresponds to a region defined on the basis of each active trench gate 11, for example. The IGBT cell includes the n$^+$-type source layer 13, the p-type base layer 15, the n-type carrier accumulation layer 2, the n$^-$-type drift layer 1, the n-type buffer layer 3, the p-type collector layer 16, the active trench gate 11, the interlayer insulating film 4, the barrier metal 5, the emitter electrode 6, and the collector electrode 7.

In the IGBT region 10, the first main surface of the semiconductor substrate corresponds to a surface (upper surface) of the n$^+$-type source layer 13 and that of the p$^+$-type contact layer 14. In the IGBT region 10, a second main surface of the semiconductor substrate corresponds to a surface (lower surface) of the p-type collector layer 16. The first main surface is the upper surface of the semicon-ductor substrate. The second main surface is a surface on the opposite side of the first main surface and is the lower surface of the semiconductor substrate. In other words, in FIG. 4, the semiconductor substrate corresponds to a range from the upper surface of the $n^+$-type source layer 13 and that of the $p^+$-type contact layer 14 to the lower surface of the p-type collector layer 16. The first main surface and the second main surface correspond to sides that are so-called a front side and a back side respectively.

The $n^-$-type drift layer 1 is formed as an inner layer of the semiconductor substrate. The $n^-$-type drift layer 1 is a semiconductor layer containing arsenic (As) or phosphorus (P) as n-type impurity, for example. Preferably, the concentration of this n-type impurity is from 1.0E+12 to 1.0E+15/ $cm^3$. The $n^-$-type drift layer 1 is derived from the configuration of the substrate before structures are formed closer to the first main surface and to the second main surface of the semiconductor substrate.

The n-type carrier accumulation layer 2 is provided closer to the first main surface of the semiconductor substrate than the $n^-$-type drift layer 1. The n-type carrier accumulation layer 2 is a semiconductor layer containing arsenic or phosphorus as n-type impurity, for example. The n-type impurity in the n-type carrier accumulation layer 2 is higher in concentration than that in the $n^-$-type drift layer 1. Preferably, the concentration of this n-type impurity is from 1.0E+13 to 1.0E+17/$cm^3$. The n-type carrier accumulation layer 2 reduces conduction loss occurring during flow of a current in the IGBT region 10.

The p-type base layer 15 is provided closer to the first main surface of the semiconductor substrate than the n-type carrier accumulation layer 2. The p-type base layer 15 is a semiconductor layer containing boron (B) or aluminum (Al) as p-type impurity, for example. Preferably, the concentration of this p-type impurity is from 1.0E+12 to 1.0E+19/$cm^3$. The p-type base layer 15 contacts the gate trench insulating film 11b of the active trench gate 11. When a gate driving voltage is applied to the gate trench electrode 11a, a channel is formed in the p-type base layer 15.

The $n^+$-type source layer 13 is provided closer to the first main surface of the semiconductor substrate than the p-type base layer 15. The $n^+$-type source layer 13 as a surface layer of the semiconductor substrate is selectively provided at the upper surface of the p-type base layer 15. A surface (upper surface) of the $n^+$-type source layer 13 forms the first main surface of the semiconductor substrate in the IGBT region 10. The $n^+$-type source layer 13 is a semiconductor layer containing arsenic or phosphorus as n-type impurity, for example. Preferably, the concentration of this n-type impurity is from 1.0E+17 to 1.0E+20/$cm^3$. The $n^+$-type source layer 13 may be called an $n^+$-type emitter layer.

The $p^+$-type contact layer 14 is provided closer to the first main surface of the semiconductor substrate than the p-type base layer 15. The $p^+$-type contact layer 14 as a surface layer of the semiconductor substrate is selectively provided at the upper surface of the p-type base layer 15. The $p^+$-type contact layer 14 is provided in a region at the upper surface of the p-type base layer 15 where the $n^+$-type source layer 13 is not provided. A surface (upper surface) of the $p^+$-type contact layer 14 forms the first main surface of the semiconductor substrate in the IGBT region 10. The $p^+$-type contact layer 14 is a semiconductor layer containing boron or aluminum as p-type impurity, for example. The p-type impurity in the $p^+$-type contact layer 14 is higher in concentration than the p-type impurity in the p-type base layer 15. Preferably, the concentration of this p-type impurity is from 1.0E+15 to 1.0E+20/$cm^3$.

The n-type buffer layer 3 is provided closer to the second main surface of the semiconductor substrate than the $n^-$-type drift layer 1. The n-type buffer layer 3 is a semiconductor layer containing phosphorus or protons ($H^+$) as n-type impurity, for example. The n-type impurity in the n-type buffer layer 3 is higher in concentration than that in the $n^-$-type drift layer 1. Preferably, the concentration of this n-type impurity is from 1.0E+12 to 1.0E+18/$cm^3$. The n-type buffer layer 3 reduces punch-through to be caused if a depletion layer extends from the p-type base layer 15 toward the second main surface while the semiconductor device 100 is in an off state.

The p-type collector layer 16 is provided closer to the second main surface of the semiconductor substrate than the n-type buffer layer 3. A surface (lower surface) of the p-type collector layer 16 forms the second main surface of the semiconductor substrate. The p-type collector layer 16 is a semiconductor layer containing boron or aluminum as p-type impurity, for example. Preferably, the concentration of this p-type impurity is from 1.0E+16 to 1.0E+20/$cm^3$.

The active trench gate 11 penetrates the $n^+$-type source layer 13, the p-type base layer 15, and the n-type carrier accumulation layer 2 from the first main surface of the semiconductor substrate and reaches the $n^-$-type drift layer 1.

The gate trench insulating film 11b is formed along an inner wall of a trench formed in the depth direction from the first main surface of the semiconductor substrate. The gate trench insulating film 11b contacts the $n^+$-type source layer 13 and the p-type base layer 15. The gate trench insulating film 11b is an oxide film, for example.

The gate trench electrode 11a is formed inside the trench across the gate trench insulating film 11b. The gate trench electrode 11a has a bottom facing the $n^-$-type drift layer 1 across the gate trench insulating film 11b. The gate trench electrode 11a is made of conductive polysilicon, for example. When a gate driving voltage is applied to the gate trench electrode 11a, a channel is formed in the p-type base layer 15 contacting the gate trench insulating film 11b.

The dummy trench gate 12 penetrates the $p^+$-type contact layer 14, the p-type base layer 15, and the n-type carrier accumulation layer 2 from the first main surface of the semiconductor substrate and reaches the $n^-$-type drift layer 1.

The dummy trench insulating film 12b is formed along an inner wall of a trench formed in the depth direction from the first main surface of the semiconductor substrate. The dummy trench insulating film 12b is an oxide film, for example.

The dummy trench electrode 12a is formed inside the trench across the dummy trench insulating film 12b. The dummy trench electrode 12a has a bottom facing the $n^-$-type drift layer 1 across the dummy trench insulating film 12b. Of the dummy trench insulating films 12b located on the both sides of the dummy trench electrode 12a, at least one of these dummy trench insulating films 12b does not contact the $n^+$-type source layer 13. The dummy trench electrode 12a is made of conductive polysilicon, for example.

The interlayer insulating film 4 is provided on the gate trench electrode 11a of the active trench gate 11.

The barrier metal 5 is formed on a region of the first main surface of the semiconductor substrate where the interlayer insulating film 4 is not provided and is formed on the interlayer insulating film 4. The barrier metal 5 is made of metal containing titanium such as Ti, TiN, or TSi, for example. A conductor containing titanium is titanium nitride or TSi, for example. TiSi is an alloy of titanium and silicon (Si). The barrier metal 5 ohmically contacts the $n^+$-type source layer 13, the $p^+$-type contact layer 14, and the dummy trench electrode 12a. The barrier metal 5 is electrically connected to the n⁺-type source layer 13, the p⁺-type contact layer 14, and the dummy trench electrode 12a.

The emitter electrode 6 is provided on the barrier metal 5. Preferably, the emitter electrode 6 is made of an aluminum alloy containing aluminum and silicon (Al—Si based alloy), for example. The emitter electrode 6 is electrically connected through the barrier metal 5 to the n⁺-type source layer 13, the p⁺-type contact layer 14, and the dummy trench electrode 12a.

The collector electrode 7 is provided on the p-type collector layer 16. Like the emitter electrode 6, the collector electrode 7 is preferably made of an aluminum alloy. The collector electrode 7 ohmically contacts the p-type collector layer 16 and is electrically connected to the p-type collector layer 16.

FIG. 5 is a sectional view showing the configuration of the IGBT region 10 in the semiconductor device 100 or 101 according to the first preferred embodiment. FIG. 5 shows a section taken along a line segment B-B in FIG. 3.

The section shown in FIG. 5 differs from the section shown in FIG. 4 in that the n⁺-type source layer 13 is not provided as a surface layer at the first main surface of the semiconductor substrate. As shown in FIG. 3, the n⁺-type source layer 13 is selectively provided at the upper surface of the p-type base layer 15.

While the configuration of the IGBT region 10 has been described above, the configuration of the IGBT region 10 is not limited to that described above. For example, the p⁺-type contact layer 14 and the p-type base layer 15 may be combined and defined as one p-type base layer.

The n-type carrier accumulation layer 2 and the n⁻-type drift layer 1 may be combined and defined as one n⁻-type drift layer. The n-type carrier accumulation layer 2 is not indispensable. The n⁻-type drift layer 1 may be provided at the location of the n-type carrier accumulation layer 2.

The n-type buffer layer 3 and the n⁻-type drift layer 1 may be combined and defined as one n-type drift layer. Furthermore, the n-type carrier accumulation layer 2, the n-type buffer layer 3, and the n⁻-type drift layer 1 may be combined and defined as one n-type drift layer. The n-type buffer layer 3 is not indispensable. The n⁻-type drift layer 1 may be provided at the location of the n-type buffer layer 3.

The barrier metal 5 is not indispensable. In the absence of the barrier metal 5, the emitter electrode 6 is provided on the n⁺-type source layer 13, on the p⁺-type contact layer 14, and on the dummy trench electrode 12a and ohmically contacts these structures. In another case, the barrier metal 5 may be provided only on an n-type semiconductor layer such as the n⁺-type source layer 13. The barrier metal 5 and the emitter electrode 6 may be combined and defined as one emitter electrode. The interlayer insulating film 4 may be provided on a partial region of the dummy trench electrode 12a. In this case, the emitter electrode 6 is electrically connected to the dummy trench electrode 12a in any region on this dummy trench electrode 12a.

The emitter electrode 6 may be composed of a plurality of metal films including an aluminum alloy film and another metal film. For example, the emitter electrode 6 may be composed of an aluminum alloy film and a plated film. The plated film is formed by electroless plating or electrolytic plating, for example. The plated film is a nickel (Ni) film, for example. A tungsten film may be formed in a fine region such as a region between the interlayer insulating films 4 adjacent to each other. The emitter electrode 6 is formed in such a manner as to cover the tungsten film. The tungsten film has more favorable embedding performance than the plated film to achieve formation of the favorable emitter electrode 6.

The collector electrode 7 may be made of an aluminum alloy and a plated film. The collector electrode 7 may have a different configuration from the emitter electrode 6.

(3) Configuration of Diode Region 20

FIG. 6 is a partially enlarged plan view showing the configuration of the diode region 20 in the semiconductor device 100 or 101 according to the first preferred embodiment. FIG. 6 shows a region 83 in an enlarged manner defined in the semiconductor device 100 in FIG. 1 or in the semiconductor device 101 in FIG. 2.

The semiconductor device 100 and the semiconductor device 101 each include a diode trench gate 21 provided in the diode region 20.

The diode trench gate 21 extends in one direction. The diode trench gate 21 of the first preferred embodiment extends in the same direction as the active trench gate 11 and the dummy trench gate 12.

The diode trench gate 21 includes a diode trench insulating film 21b and a diode trench electrode 21a. While a sectional structure of the diode trench gate 21 will be described later in detail, the diode trench insulating film 21b is formed along an inner wall of a trench formed in the depth direction from the first main surface of the semiconductor substrate. The diode trench electrode 21a is formed inside the trench across the diode trench insulating film 21b.

In the diode region 20, a p⁺-type contact layer 24 and a p-type anode layer 25 are formed selectively as a surface layer at the first main surface of the semiconductor substrate. In the first preferred embodiment, the p⁺-type contact layer 24 and the p-type anode layer 25 are provided alternately in a direction in which the diode trench gate 21 extends (lengthwise direction thereof). The diode trench gate 21 is provided in such a manner as to cross these p⁺-type contact layer 24 and p-type anode layer 25. The p⁺-type contact layer 24 and the p-type anode layer 25 are provided between two diode trench gates 21 adjacent to each other. The p⁺-type contact layer 24 and the p-type anode layer 25 will be described later in detail.

FIG. 7 is a sectional view showing the configuration of the diode region 20 in the semiconductor device 100 or 101 according to the first preferred embodiment. FIG. 7 shows a section taken along a line segment C-C in FIG. 6.

In the diode region 20, the semiconductor device 100 and the semiconductor device 101 each include the p⁺-type contact layer 24, the p-type anode layer 25, the n-type carrier accumulation layer 2, the n⁻-type drift layer 1, the n-type buffer layer 3, an n⁺-type cathode layer 26, the diode trench gate 21, the barrier metal 5, the emitter electrode 6, and the collector electrode 7.

One diode cell corresponds to a region defined on the basis of each diode trench gate 21, for example. The diode cell includes the p⁺-type contact layer 24, the p-type anode layer 25, the n-type carrier accumulation layer 2, the n⁻-type drift layer 1, the n-type buffer layer 3, the n⁺-type cathode layer 26, the diode trench gate 21, the barrier metal 5, the emitter electrode 6, and the collector electrode 7.

In the diode region 20, the first main surface of the semiconductor substrate corresponds to a surface (upper surface) of the p⁺-type contact layer 24. This first main surface in the diode region 20 extends continuously from the first main surface in the IGBT region 10. In the diode region 20, the second main surface corresponds to a surface (lower surface) of the n⁺-type cathode layer 26. The second main surface of the semiconductor substrate in the diode region 20 extends continuously from the second main surface in the IGBT region 10. In FIG. 7, the semiconductor substrate corresponds to a range from the upper surface of the p$^+$-type contact layer 24 to the lower surface of the n$^+$-type cathode layer 26.

The n$^-$-type drift layer 1 is formed as an inner layer of the semiconductor substrate. Like the n$^-$-type drift layer 1 in the IGBT region 10, the n$^-$-type drift layer 1 in the diode region 20 is provided between the first main surface and the second main surface of the semiconductor substrate. Like the n$^-$-type drift layer 1 in the IGBT region 10, the n$^-$-type drift layer 1 in the diode region 20 may be derived from the configuration of the substrate before structures are formed closer to the first main surface and to the second main surface of the semiconductor substrate. Specifically, the n$^-$-type drift layer 1 in the diode region 20 and that in the IGBT region 10 are formed continuously and integrally with each other. In other words, the n$^-$-type drift layer 1 in the diode region 20 and that in the IGBT region 10 are formed in the same semiconductor substrate.

The n-type carrier accumulation layer 2 is provided closer to the first main surface of the semiconductor substrate than the n$^-$-type drift layer 1. The n-type carrier accumulation layer 2 in the diode region 20 extends in the same plane as the n-type carrier accumulation layer 2 in the IGBT region 10. For example, the thickness of and an impurity concentration in the n-type carrier accumulation layer 2 in the diode region 20 are the same as those of the n-type carrier accumulation layer 2 in the IGBT region 10.

The p-type anode layer 25 is provided closer to the first main surface of the semiconductor substrate than the n-type carrier accumulation layer 2. The p-type anode layer 25 is a semiconductor layer containing boron or aluminum as p-type impurity, for example. Preferably, the concentration of this p-type impurity is from 1.0E+12 to 1.0E+19/cm$^3$. The concentration of the p-type impurity in the p-type anode layer 25 is the same as the concentration of the p-type impurity in the p-type base layer 15 in the IGBT region 10, for example. If these layers are formed to have the same concentration of the p-type impurity, the p-type anode layer 25 is formed simultaneously with the p-type base layer 15, for example. As another example, the concentration of the p-type impurity in the p-type anode layer 25 may be lower than the concentration of the p-type impurity in the p-type base layer 15 in the IGBT region 10. If the p-type anode layer 25 has a lower concentration of the p-type impurity, the quantity of holes to be injected into the diode region 20 is reduced during the operation of a diode. This reduces recovery loss occurring during the operation of the diode.

The p$^+$-type contact layer 24 is provided closer to the first main surface of the semiconductor substrate than the p-type anode layer 25. As shown in FIG. 6 and FIG. 8 referred to later, the p$^+$-type contact layer 24 is formed selectively at the upper surface of the p-type anode layer 25. In the cross section along C-C shown in FIG. 7, however, the p$^+$-type contact layer 24 covers the p-type anode layer 25 entirely. In other words, in the diode region 20, the p$^+$-type contact layer 24 as a surface layer at the first main surface of the semiconductor substrate is selectively provided at the upper surface of the p-type anode layer 25. The p$^+$-type contact layer 24 is a semiconductor layer containing boron or aluminum as p-type impurity, for example. The concentration of the p-type impurity in the p$^+$-type contact layer 24 is higher than the concentration of the p-type impurity in the p-type anode layer 25. Preferably, the concentration of this p-type impurity is from 1.0E+15 to 1.0E+20/cm$^3$.

The n-type buffer layer 3 is provided closer to the second main surface of the semiconductor substrate than the n$^-$-type drift layer 1. The n-type buffer layer 3 in the diode region 20 extends in the same plane as the n-type buffer layer 3 in the IGBT region 10. For example, the thickness of and an impurity concentration in the n-type buffer layer 3 in the diode region 20 are the same as those of the n-type buffer layer 3 in the IGBT region 10.

The n$^+$-type cathode layer 26 is provided closer to the second main surface of the semiconductor substrate than the n-type buffer layer 3. A surface (lower surface) of the n$^+$-type cathode layer 26 forms the second main surface of the semiconductor substrate. The n$^+$-type cathode layer 26 is a semiconductor layer containing arsenic or phosphorus as n-type impurity, for example. Preferably, the concentration of this n-type impurity is from 1.0E+16 to 1.0E+21/cm$^3$.

The diode trench gate 21 penetrates the p$^+$-type contact layer 24, the p-type anode layer 25, and the n-type carrier accumulation layer 2 from the first main surface of the semiconductor substrate and reaches the n$^-$-type drift layer 1.

The diode trench insulating film 21$b$ is formed along an inner wall of a trench formed in the depth direction from the first main surface of the semiconductor substrate. The diode trench insulating film 21$b$ is an oxide film, for example.

The diode trench electrode 21$a$ is formed inside the trench across the diode trench insulating film 21$b$. The diode trench electrode 21$a$ has a bottom facing the n$^-$-type drift layer 1 across the diode trench insulating film 21$b$. The diode trench electrode 21$a$ is made of conductive polysilicon, for example.

The barrier metal 5 is provided on the p$^+$-type contact layer 24 and on the diode trench electrode 21$a$. Like the barrier metal 5 in the IGBT region 10, the barrier metal 5 is made of metal containing titanium such as Ti, TiN, or TiSi, for example. The barrier metal 5 ohmically contacts the p$^+$-type contact layer 24 and the diode trench electrode 21$a$.

The emitter electrode 6 is provided on the barrier metal 5. Like the emitter electrode 6 in the IGBT region 10, the emitter electrode 6 is preferably made of an aluminum alloy (Al—Si based alloy), for example. The emitter electrode 6 is electrically connected through the barrier metal 5 to the diode trench electrode 21$a$ and the p$^+$-type contact layer 24.

The collector electrode 7 is provided on the n$^+$-type cathode layer 26. Like the collector electrode 7 in the IGBT region 10, the collector electrode 7 is preferably made of an aluminum alloy. The collector electrode 7 ohmically contacts the n$^+$-type cathode layer 26.

FIG. 8 is a sectional view showing the configuration of the diode region 20 in the semiconductor device 100 or 101 according to the first preferred embodiment. FIG. 8 shows a section taken along a line segment D-D in FIG. 6.

The section shown in FIG. 8 differs from the section shown in FIG. 7 in that the p$^+$-type contact layer 24 is not provided at the first main surface of the semiconductor substrate. As shown in FIG. 6, the p$^+$-type contact layer 24 is selectively provided at the upper surface of the p-type anode layer 25. In a part of the diode region 20 where the p$^+$-type contact layer 24 is not provided, the first main surface of the semiconductor substrate corresponds to a surface (upper surface) of the p-type anode layer 25. In the section shown in FIG. 8, one diode cell includes the p-type anode layer 25, the n-type carrier accumulation layer 2, the n$^-$-type drift layer 1, the n-type buffer layer 3, the n$^+$-type cathode layer 26, the barrier metal 5, the emitter electrode 6, and the collector electrode 7.

While the configuration of the diode region 20 has been described above, the configuration of the diode region 20 is not limited to that described above. For example, the p$^+$-type contact layer 24 and the p-type anode layer 25 may be combined and defined as one p-type anode layer. The concentration of the p-type impurity in the p$^+$-type contact layer 24 may be the same as or different from the concentration of the p-type impurity in the p$^+$-type contact layer 14 in the IGBT region 10.

The n-type carrier accumulation layer 2 and the n$^-$-type drift layer 1 may be combined and defined as one n-type drift layer. The n-type carrier accumulation layer 2 in the diode region 20 is not indispensable. The n$^-$-type drift layer 1 may be provided at the location of the n-type carrier accumulation layer 2. While the n-type carrier accumulation layer 2 is provided in the IGBT region 10, the n-type carrier accumulation layer 2 is not required to be provided in the diode region 20.

The n-type buffer layer 3 and the n$^-$-type drift layer 1 may be combined and defined as one n-type drift layer. Furthermore, the n-type carrier accumulation layer 2, the n-type buffer layer 3, and the if-type drift layer 1 may be combined and defined as one n-type drift layer. The n-type buffer layer 3 is not indispensable. The n$^-$-type drift layer 1 may be provided at the location of the n-type buffer layer 3.

The n$^+$-type cathode layer 26 may be provided in an entire area or in a partial area of the diode region 20. While not shown in the drawings, the semiconductor device 100 and the semiconductor device 101 may each include a semiconductor layer with the n$^+$-type cathode layer 26 and a p$^+$-type cathode layer arranged alternately as a semiconductor layer forming the second main surface of the semiconductor substrate in the diode region 20. Such a configuration is formed by the step of implanting p-type impurity selectively into a part of a region where the n$^+$-type cathode layer 26 is formed, for example. A diode including the semiconductor layer with the n$^+$-type cathode layer 26 and the p$^+$-type cathode layer arranged alternately is called a relaxed field of cathode (RFC) diode.

The barrier metal 5 is not indispensable. In the absence of the barrier metal 5, the emitter electrode 6 is provided on the p-type anode layer 25, on the p$^+$-type contact layer 24, and on the diode trench electrode 21$a$ and ohmically contacts these structures. The interlayer insulating film 4 may be provided on a partial region of the diode trench electrode 21$a$. In this case, the emitter electrode 6 is electrically connected to the diode trench electrode 21$a$ in any region on this diode trench electrode 21$a$.

(4) Configuration of Boundary Area Between IGBT Region 10 and Diode Region 20

FIG. 9 is a sectional view showing the configuration of a boundary area between the IGBT region 10 and the diode region 20. FIG. 9 shows a section taken along a line segment E-E in FIG. 1 or 2.

The p-type collector layer 16 provided at the second main surface in the IGBT region 10 protrudes from a boundary between the IGBT region 10 and the diode region 20 into the diode region 20 by a distance U1. This increases a distance between the n$^+$-type cathode layer 26 and the active trench gate 11, compared to a configuration where the p-type collector layer 16 does not protrude into the diode region 20. Even if a gate driving voltage is applied to the gate trench electrode 11$a$ during operation of a free wheeling diode, this configuration still reduces a current to flow from a channel formed adjacent to the active trench gate 11 into the n$^+$-type cathode layer 26. The distance U1 is 100 μm, for example. In response to purpose of use of the semiconductor device 100 or the semiconductor device 101, however, the distance U1 may be 0 μm or less than 100 μm.

(5) Configuration of Terminal Region 30

FIG. 10 is a sectional view showing the configuration of a boundary area between the IGBT region 10 and the terminal region 30. FIG. 10 shows a section taken along a line segment F-F in FIG. 1 or 2. FIG. 11 is a sectional view showing the configuration of a boundary area between the diode region 20 and the terminal region 30. FIG. 11 shows a section taken along a line segment G-G in FIG. 1.

In the terminal region 30, the semiconductor devices 100 and 101 each include a p-type terminal well layer 31, an n$^+$-type channel stopper layer 32, the n$^-$-type drift layer 1, the n-type buffer layer 3, a p-type terminal collector layer 16$a$, the interlayer insulating film 4, the barrier metal 5, the emitter electrode 6, a terminal electrode 6$a$, a semi-insulating film 33, a terminal protective film 34, and the collector electrode 7.

Of the above-described structures, the p-type terminal well layer 31, the n$^+$-type channel stopper layer 32, the n$^-$-type drift layer 1, the n-type buffer layer 3, and the p-type terminal collector layer 16$a$ are provided between the first main surface and the second main surface of the semiconductor substrate.

In the terminal region 30, the first main surface of the semiconductor substrate corresponds to a surface (upper surface) of the n$^-$-type drift layer 1, that of the p-type terminal well layer 31, and that of the n$^+$-type channel stopper layer 32. This first main surface in the terminal region 30 extends continuously from the first main surface in the IGBT region 10 or in the diode region 20. In the terminal region 30, the second main surface of the semiconductor substrate corresponds to a surface (lower surface) of the p-type terminal collector layer 16$a$. This second main surface in the terminal region 30 extends continuously from the second main surface in the IGBT region 10 or in the diode region 20.

Like the n$^-$-type drift layer 1 in each of the IGBT region 10 and the diode region 20, the n$^-$-type drift layer 1 is provided between the first main surface and the second main surface of the semiconductor substrate. On the other hand, the n$^-$-type drift layer 1 in the terminal region 30 is partially exposed as a surface layer of the semiconductor substrate to the first main surface. Like the n$^-$-type drift layer 1 in each of the IGBT region 10 and the diode region 20, the n$^-$-type drift layer 1 in the terminal region 30 may be derived from the configuration of the substrate before structures are formed closer to the first main surface or to the second main surface of the semiconductor substrate. Specifically, the n$^-$-type drift layer 1 in the terminal region 30, that in the IGBT region 10, and that in the diode region 20 are formed continuously and integrally with each other. In other words, the n$^-$-type drift layer 1 in the terminal region 30, that in the IGBT region 10, and that in the diode region 20 are formed in the same semiconductor substrate.

The p-type terminal well layer 31 is provided closer to the first main surface of the semiconductor substrate than the n$^-$-type drift layer 1. In a plan view, the p-type terminal well layer 31 is provided in such a manner as to surround the cell region. In the first preferred embodiment, three p-type terminal well layers 31 form a triple ring and surround the cell region in a plan view. These three p-type terminal well layers 31 form an FLR. The number of the p-type terminal well layers 31 is not limited to three. The number of the p-type terminal well layers 31 is selected appropriately in designing the breakdown voltage of the semiconductor device 100 or the semiconductor device 101. The p-type terminal well layer 31 is a semiconductor layer containing boron or aluminum as p-type impurity, for example. The concentration of this p-type impurity is from 1.0E+14 to 1.0E+19/cm$^3$.

The n$^+$-type channel stopper layer 32 is provided closer to the first main surface of the semiconductor substrate than the n$^-$-type drift layer 1. In a plan view, the n$^+$-type channel stopper layer 32 is provided still external to the p-type terminal well layer 31. The n$^+$-type channel stopper layer 32 is provided in such a manner as to surround the p-type terminal well layer 31.

The n-type buffer layer 3 is provided closer to the second main surface of the semiconductor substrate than the n$^-$-type drift layer 1. The n-type buffer layer 3 in the terminal region 30 has a configuration similar to that of the n-type buffer layer 3 in the IGBT region 10 or in the diode region 20. The n-type buffer layer 3 in the terminal region 30 is formed continuously and integrally with the n-type buffer layer 3 in the IGBT region 10 or in the diode region 20. The n-type buffer layer 3 and the n$^-$-type drift layer 1 may be combined and defined as one n-type drift layer. The n-type buffer layer 3 is not indispensable. The n$^-$-type drift layer 1 may be provided at the location of the n-type buffer layer 3.

The p-type terminal collector layer 16a is provided closer to the second main surface of the semiconductor substrate than the n-type buffer layer 3. The p-type terminal collector layer 16a has a configuration similar to that of the p-type collector layer 16 in the IGBT region 10. The p-type terminal collector layer 16a is formed continuously and integrally with the p-type collector layer 16 in the IGBT region 10. The p-type terminal collector layer 16a in the terminal region 30 and the p-type collector layer 16 in the IGBT region 10 may be combined and defined as one p-type collector layer.

As shown in FIG. 11, the p-type terminal collector layer 16a protrudes from a boundary between the diode region 20 and the terminal region 30 into the diode region 20 by a distance U2. This increases a distance between the n$^+$-type cathode layer 26 and the p-type terminal well layer 31, compared to a configuration where the p-type terminal collector layer 16a does not protrude into the diode region 20. This configuration prevents the p-type terminal well layer 31 from operating as an anode of a free wheeling diode. The distance U2 is 100 μm, for example.

The interlayer insulating film 4 is provided on the first main surface of the semiconductor substrate. The interlayer insulating film 4 has contact holes. The contact holes are formed at positions corresponding to those of the p-type terminal well layer 31 and the n$^+$-type channel stopper layer 32. A surface of the p-type terminal well layer 31 or that of the n$^+$-type channel stopper layer 32 is exposed through the contact hole.

The barrier metal 5 is provided on the p-type terminal well layer 31 and on the n$^+$-type channel stopper layer 32.

The emitter electrode 6 is provided in such a manner as to be electrically connected through the barrier metal 5 to the p-type terminal well layer 31 near the IGBT region 10 or the diode region 20. The emitter electrode 6 in the terminal region 30 is formed continuously and integrally with the emitter electrode 6 in the IGBT region 10 or in the diode region 20.

The terminal electrode 6a is separated from the emitter electrode 6 and provided external to the emitter electrode 6. The terminal electrode 6a is electrically connected through the barrier metal 5 in the contact holes to the p-type terminal well layer 31 and the n$^+$-type channel stopper layer 32.

The semi-insulating film 33 is provided in such a manner as to electrically connect the emitter electrode 6 and the terminal electrode 6a to each other. The semi-insulating film 33 is a semi-insulating silicon nitride film (sin SiN), for example.

The terminal protective film 34 covers the emitter electrode 6, the terminal electrode 6a, and the semi-insulating film 33. The terminal protective film 34 is made of polyimide, for example.

The collector electrode 7 is provided on the p-type terminal collector layer 16a, namely, on the second main surface of the semiconductor substrate. The collector electrode 7 in the terminal region 30 is formed continuously and integrally with the collector electrode 7 in the IGBT region 10 and in the diode region 20.

(6) Configuration of Capacitance Adjusting Region 50

Figure 12:
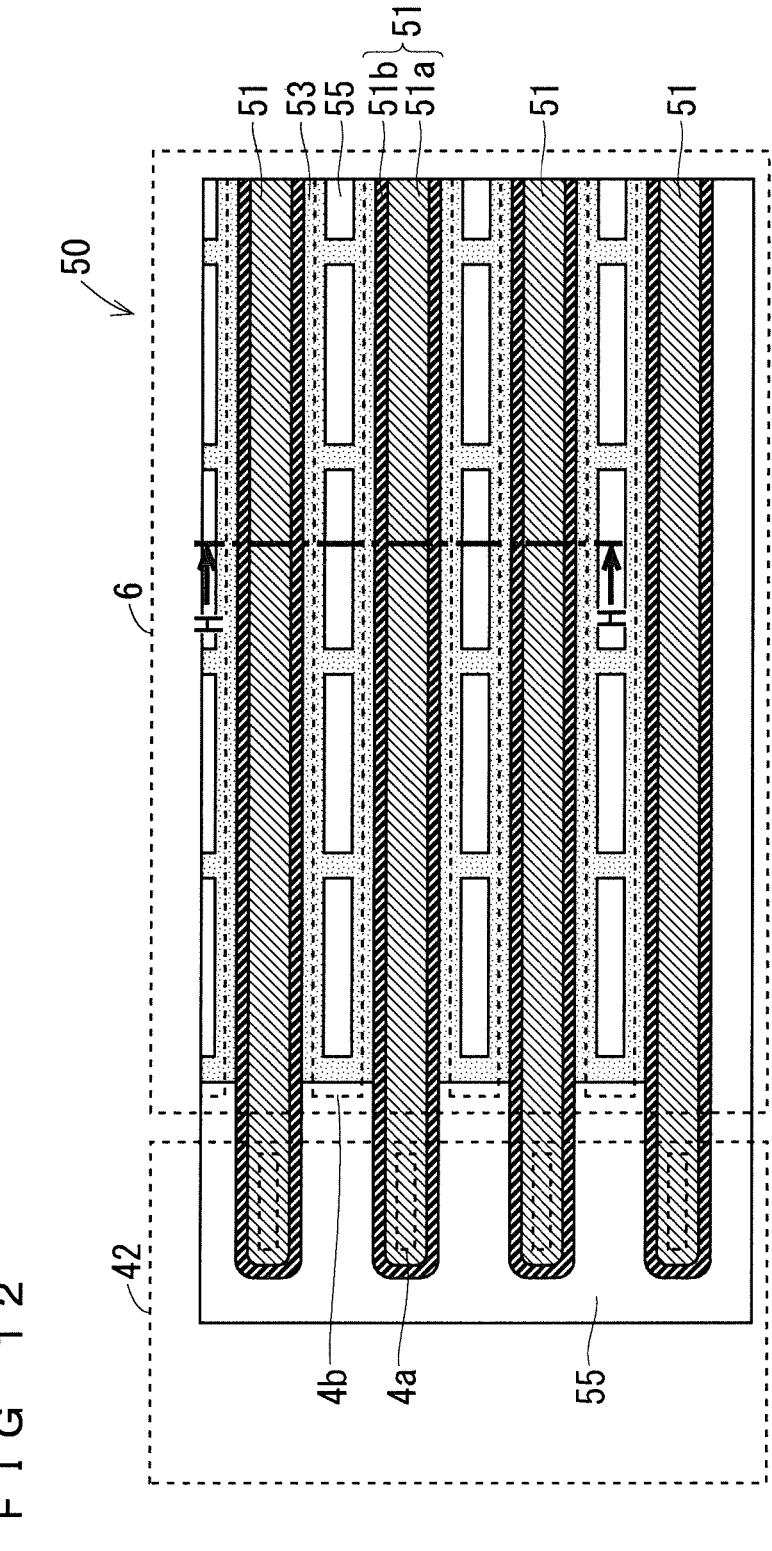
FIG. 12 is a plan view showing the configuration of a capacitance adjusting region in the semiconductor device according to the first preferred embodiment.

FIG. 12 is a plan view showing the configuration of the capacitance adjusting region 50 in the semiconductor device 100 or 101 according to the first preferred embodiment. FIG. 12 shows arrangement of the semiconductor layers, etc. forming the first main surface of the semiconductor substrate and shows a state in which the interlayer insulating film 4, the barrier metal 5, the emitter electrode 6, and a gate line 42 on the first main surface of the semiconductor substrate are seen through.

The semiconductor device 100 and the semiconductor device 101 each include a control trench gate 51 in the capacitance adjusting region 50.

The control trench gate 51 extends in one direction. In the first preferred embodiment, the control trench gate 51 extends in the same direction as the active trench gate 11 and the dummy trench gate 12. However, a direction in which the control trench gate 51 extends is not limited to this.

The control trench gate 51 includes a control trench insulating film 51b and a control trench electrode 51a. While a sectional structure of the control trench gate 51 will be described later in detail, the control trench insulating film 51b is formed along an inner wall of a trench formed in the depth direction from the first main surface of the semiconductor substrate. The control trench electrode 51a is formed inside the trench across the control trench insulating film 51b.

In the capacitance adjusting region 50, a p-type semiconductor layer 55 is provided as a surface layer at the first main surface of the semiconductor substrate. An n$^+$-type source layer 53 is further provided selectively on the p-type semiconductor layer 55. The n$^+$-type source layer 53 contacts both side surfaces of the control trench gate 51 and extends along these both side surfaces.

The interlayer insulating film 4 includes a plurality of contact holes 4a and 4b. In FIG. 12, the interlayer insulating film 4 covers a region other than the contact holes 4a and 4b. The contact hole 4a is provided on the control trench electrode 51a at an end portion of the control trench gate 51. The control trench electrode 51a is exposed through the contact hole 4a. The contact hole 4b is provided between two control trench gates 51 adjacent to each other. The n$^+$-type source layer 53 and the p-type semiconductor layer 55 are exposed through the contact hole 4b.

The gate line 42 covers an end portion of the control trench gate 51. The gate line 42 is electrically connected through the contact hole 4a to the control trench electrode 51a. While not shown in the drawings, the gate line 42 is electrically connected to the gate pad 41c and the gate trench electrode 11a. Thus, the control trench electrode 51a is at a potential substantially the same as that of the gate trench electrode 11a.

Not all the control trench electrodes 51a are required to be connected to the gate line 42 but at least one control trench electrode 51a may electrically be connected to the gate line 42. The control trench electrode 51a may electrically be connected to the gate pad 41c directly without intervention of the gate line 42.

The emitter electrode 6 covers a region internal to both ends of the control trench gate 51. While not shown in the drawings, the emitter electrode 6 extends from the IGBT region 10 into the capacitance adjusting region 50. Namely, the emitter electrode 6 in the capacitance adjusting region 50 is electrically connected to the emitter electrode 6 in the IGBT region 10. The emitter electrode 6 ohmically contacts the n$^+$-type source layer 53 and the p-type semiconductor layer 55 through the contact hole 4b.

FIG. 13 is a sectional view showing the configuration of the capacitance adjusting region 50 in the semiconductor device 100 or 101 according to the first preferred embodiment. FIG. 13 shows a section taken along a line segment H-H in FIG. 12.

In the capacitance adjusting region 50, the semiconductor device 100 and the semiconductor device 101 each include the n$^+$-type source layer 53, the p-type semiconductor layer 55, the n$^-$-type drift layer 1, the n-type buffer layer 3, the p-type collector layer 16, the control trench gate 51, the interlayer insulating film 4, the barrier metal 5, the emitter electrode 6, and the collector electrode 7.

One capacitance adjusting cell corresponds to a region defined on the basis of each control trench gate 51, for example. The capacitance adjusting cell includes the n$^+$-type source layer 53, the p-type semiconductor layer 55, the n$^-$-type drift layer 1, the n-type buffer layer 3, the p-type collector layer 16, the control trench gate 51, the interlayer insulating film 4, the barrier metal 5, the emitter electrode 6, and the collector electrode 7.

In the capacitance adjusting region 50, the first main surface of the semiconductor substrate corresponds to a surface (upper surface) of the n$^+$-type source layer 53 and that of the p-type semiconductor layer 55. In the capacitance adjusting region 50, the second main surface of the semiconductor substrate corresponds to a surface (lower surface) of the p-type collector layer 16. In other words, in FIG. 13, the semiconductor substrate corresponds to a range from the upper surface of the n$^+$-type source layer 53 and that of the p-type semiconductor layer 55 to the lower surface of the p-type collector layer 16.

The n$^-$-type drift layer 1 is formed as an inner layer of the semiconductor substrate. The n$^-$-type drift layer 1 in the capacitance adjusting region 50 has a configuration similar to that of the n$^-$-type drift layer 1 in the IGBT region 10. The n$^-$-type drift layer 1 in the capacitance adjusting region 50 and that in the IGBT region 10 are formed continuously and integrally with each other.

The p-type semiconductor layer 55 is provided closer to the first main surface of the semiconductor substrate than the n$^-$-type drift layer 1. The p-type semiconductor layer 55 is a semiconductor layer containing boron or aluminum as p-type impurity, for example. The concentration of this p-type impurity is from 1.0E+14 to 1.0E+19/cm$^3$. For example, the p-type semiconductor layer 55 is formed simultaneously with the p-type terminal well layer 31 in the terminal region 30. The p-type semiconductor layer 55 is a diffusion layer formed by ion implantation of the p-type impurity and thermal treatment, for example.

The n$^+$-type source layer 53 is provided closer to the first main surface of the semiconductor substrate than the p-type semiconductor layer 55. The n$^+$-type source layer 53 as a surface layer of the semiconductor substrate is selectively provided at the upper surface of the p-type semiconductor layer 55. The n$^+$-type source layer 53 is a semiconductor layer containing arsenic or phosphorus as n-type impurity, for example. Preferably, the concentration of this n-type impurity is from 1.0E+17 to 1.0E+20/cm$^3$. The n$^+$-type source layer 53 in the capacitance adjusting region 50 may be formed simultaneously with the n$^+$-type source layer 13 in the IGBT region 10, for example.

The n-type buffer layer 3 and the p-type collector layer 16 in the capacitance adjusting region 50 have configurations similar to those of the n-type buffer layer 3 and the p-type collector layer 16 in the IGBT region 10 respectively.

The control trench gate 51 penetrates the n$^+$-type source layer 53 from the first main surface of the semiconductor substrate. A tip of the trench is located in the p-type semiconductor layer 55 and does not reach the n$^-$-type drift layer 1.

The control trench insulating film 51b is formed along an inner wall of the trench. The control trench insulating film 51b contacts the n$^+$-type source layer 53 and the p-type semiconductor layer 55. The control trench insulating film 51b is an oxide film, for example. The control trench insulating film 51b has a configuration similar to that of the gate trench insulating film 11b, for example.

The control trench electrode 51a is formed inside the trench across the control trench insulating film 51b. The control trench electrode 51a has a bottom facing the p-type semiconductor layer 55 across the control trench insulating film 51b. The control trench electrode 51a is made of conductive polysilicon, for example. The control trench electrode 51a has a configuration similar to that of the gate trench electrode 11a, for example.

As shown in FIG. 12, the interlayer insulating film 4 covers a region other than the contact holes 4a and 4b. In other words, the interlayer insulating film 4 in FIG. 13 is provided on the control trench electrode 51a.

The barrier metal 5, the emitter electrode 6, and the collector electrode 7 in the capacitance adjusting region 50 have configurations similar to those of the barrier metal 5, the emitter electrode 6, and the collector electrode 7 in the IGBT region 10 respectively.

The foregoing description is summarized as follows. The semiconductor device 100 or 101 according to the first preferred embodiment includes the semiconductor substrate, the IGBT region 10, and the capacitance adjusting region 50. The IGBT region 10 and the capacitance adjusting region 50 are provided in the semiconductor substrate. The IGBT region 10 includes an IGBT.

The capacitance adjusting region 50 includes the p-type semiconductor layer 55, the n$^+$-type source layer 53, and the control trench gates 51. The p-type semiconductor layer 55 is provided as a surface layer at the upper surface of the semiconductor substrate. The n$^+$-type source layer 53 as a surface layer of the semiconductor substrate is selectively provided at the upper surface of the p-type semiconductor layer 55. Each of the control trench gates 51 includes the control trench insulating film 51b and the control trench electrode 51a. The control trench insulating film 51b is formed on an inner wall of a trench. The trench penetrates the n$^+$-type source layer 53 from the upper surface of the semiconductor substrate and has a tip located in the p-type semiconductor layer 55. The control trench electrode 51a is formed inside the trench across the control trench insulating film 51b.

The n$^+$-type source layer 53 contacts a side surface of each of the control trench gates 51. The p-type semiconductor layer 55 and the $n^+$-type source layer 53 are electrically connected to the emitter electrode 6 of the IGBT. The control trench electrode 51a of at least one control trench gate 51 of the control trench gates 51 is electrically connected to the gate trench electrode 11a of the IGBT.

In the semiconductor device 100 or 101 described above, the control trench electrode 51a is a potential substantially the same as those of the gate trench electrode 11a and the gate pad 41c. The p-type semiconductor layer 55 ohmically contacts the emitter electrode 6. A capacitance is formed between the control trench electrode 51a and the p-type semiconductor layer 55 and this capacitance functions as an additive capacitance ($C_{ge'}$) between the gate and the emitter.

If the configurations of the active trench gate 11 and its surrounding in the IGBT region 10 are changed in order to adjust a ratio between an input capacitance ($C_{ge}+C_{gc}$) and a feedback capacitance ($C_{gc}$), both the input capacitance ($C_{ge}+C_{gc}$) and the feedback capacitance ($C_{gc}$) are changed. This narrows a range in which the ratio between the input capacitance ($C_{ge}+C_{gc}$) and the feedback capacitance ($C_{gc}$) is freely adjustable. On the other hand, in the semiconductor device 100 or 101, the ratio between the input capacitance ($C_{ge}+C_{gc}$) and the feedback capacitance ($C_{gc}$) is adjusted using the additive capacitance ($C_{ge'}$) formed in the capacitance adjusting region 50. Specifically, a range in which this ratio is adjustable is expanded.

Furthermore, as the $n^+$-type source layer 53 is arranged in such a manner as to contact the control trench gate 51 and to be electrically connected to the emitter electrode 6, the frequency response of the additive capacitance ($C_{ge'}$) formed in the capacitance adjusting region 50 is improved. Furthermore, the additive capacitance ($C_{ge'}$) is stably formed with respect to switching operation speed of the IGBT. The semiconductor device 100 or 101 allows the ratio between the input capacitance ($C_{ge}+C_{gc}$) and the feedback capacitance ($C_{gc}$) to be optimized to reduce switching loss without changing the configuration of the IGBT region 10.

The semiconductor device 100 or 101 is an RC-IGBT in the example described in the first preferred embodiment. However, even if the diode region 20 is omitted from the semiconductor device 100 or 101, effect comparable to that described above is still achieved.

First Modification of First Preferred Embodiment

Preferably, a pitch of the control trench gates 51 is narrower than a pitch of the active trench gates 11. This increases the additive capacitance ($C_{ge'}$) per unit area formable in the capacitance adjusting region 50. As a result, a range in which the ratio between the input capacitance ($C_{ge}+C_{gc}$) and the feedback capacitance ($C_{gc}$) is adjustable is expanded.

Second Modification of First Preferred Embodiment

Preferably, the control trench insulating film 51b is thinner than the gate trench insulating film 11b. This increases the additive capacitance ($C_{ge'}$) per unit area formable in the capacitance adjusting region 50. As a result, a range in which the ratio between the input capacitance ($C_{ge}+C_{gc}$) and the feedback capacitance ($C_{gc}$) is adjustable is expanded.

Third Modification of First Preferred Embodiment

Preferably, the control trench gate 51 has a depth from the upper surface of the semiconductor substrate greater than that of the active trench gate 11 from the upper surface of the semiconductor substrate. This increases the additive capacitance ($C_{ge'}$) per unit area formable in the capacitance adjusting region 50. As a result, a range in which the ratio between the input capacitance ($C_{ge}+C_{gc}$) and the feedback capacitance ($C_{gc}$) is adjustable is expanded.

Fourth Modification of First Preferred Embodiment

FIG. 14 is a plan view showing the configuration of the capacitance adjusting region 50 according to a fourth modification of the first preferred embodiment. Like FIG. 12, FIG. 14 shows a state in which the interlayer insulating film 4, the barrier metal 5, the emitter electrode 6, and the gate line 42 are seen through.

The width of the contact hole 4b shown in FIG. 14 is smaller than that of the contact hole 4b shown in FIG. 12. The $n^+$-type source layer 53 is exposed discontinuously through the contact hole 4b in a direction in which the contact hole 4b extends. This configuration still achieves the above-described effect.

Fifth Modification of First Preferred Embodiment

FIG. 15 is a plan view showing the configuration of the capacitance adjusting region 50 according to a fifth modification of the first preferred embodiment. Like FIG. 12, FIG. 15 shows a state in which the interlayer insulating film 4, the barrier metal 5, the emitter electrode 6, and the gate line 42 are seen through.

In a plan view, the $n^+$-type source layer 53 may be arranged in such a manner as to partially contact both side surfaces of the control trench gate 51. This configuration still achieves the above-described effect.

Second Preferred Embodiment

A semiconductor device according to a second preferred embodiment will be described. The second preferred embodiment is a subordinate concept of the first preferred embodiment. In the second preferred embodiment, a constituting element corresponding to that of the first preferred embodiment is given the same reference sign and will not be described in detail.

FIG. 16 is a plan view showing the configuration of the capacitance adjusting region 50 in the semiconductor device 100 or 101 according to the second preferred embodiment. FIG. 16 shows a state in which the interlayer insulating film 4, the barrier metal 5, the emitter electrode 6, the gate line 42, and the control pad 41 are seen through.

The emitter electrode 6 extends from the IGBT region 10 into the capacitance adjusting region 50, and is arranged between the control pad 41 and the gate line 42 in a plan view.

The control trench gate 51 extends in one direction while passing directly under the control pad 41. In other words, the control trench gate 51 is covered with the control pad 41 at least partially. While the control pad 41 is any one of the current sense pad 41a, the kelvin emitter pad 41b, the gate pad 41c, and the temperature sense diode pads 41d and 41e, for example, it is not limited to these pads.

An end portion of the control trench gate 51 is not covered with the control pad 41 but is covered with the gate line 42. The contact hole 4a for connecting the control trench electrode 51a and the gate line 42 to each other is formed only at the end portion of the control trench gate 51. The control trench electrode 51a is electrically connected through the contact hole $4a$ to the gate line $42$ only at the end portion of the control trench gate $51$.

The contact hole $4b$ for connecting to the p-type semiconductor layer $55$ and the $n^+$-type source layer $53$ to the emitter electrode $6$ is formed only in a region between the control pad $41$ and the gate line $42$. Here, the contact hole $4b$ is provided at a position closer to the end portion than to a central portion of the control trench gate $51$ as viewed in the direction in which the control trench gate $51$ extends. The p-type semiconductor layer $55$ and the $n^+$-type source layer $53$ are electrically connected through the contact hole $4b$ to the emitter electrode $6$ only in the region between the control pad $41$ and the gate line $42$.

As a part of the capacitance adjusting cell is further formed directly under the control pad $41$, the chip area of the semiconductor device $100$ or $101$ is reduced. Even if the chip area is maintained, the area of the capacitance adjusting region $50$ is increased to expand a range in which the ratio between the input capacitance ($C_{ge}+C_{gc}$) and the feedback capacitance ($C_{gc}$) is adjustable.

FIG. $17$ shows a relationship between a voltage to be applied to the control trench electrode $51a$ and the additive capacitance ($C_{ge'}$). FIG. $17$ shows simulation results obtained by 3D technology CAD (TCAD). FIG. $17$ shows two results obtained in a configuration with the $n^+$-type source layer $53$ and in a configuration without the $n^+$-type source layer $53$ based on the configuration shown in FIG. $16$.

Regarding the control trench electrode $51a$ connected to the gate trench electrode $11a$ and the gate pad $41c$, a voltage applied to this control trench electrode $51a$ corresponds to a gate driving voltage in the IGBT.

In the absence of the $n^+$-type source layer $53$, the additive capacitance ($C_{ge'}$) is reduced in a region where a voltage at the control trench electrode $51a$ is high (equal to or greater than 10 V, for example). Specifically, the additive capacitance ($C_{ge'}$) is not stable in a voltage range shown in FIG. $17$. This phenomenon is common frequency dependence caused for the reason that an inversion layer formed around the control trench electrode $51a$, namely, around the MOS structure fails to follow high-frequency voltage fluctuation. Here, the contact hole $4b$ for connecting the p-type semiconductor layer $55$ and the emitter electrode $6$ to each other is provided closer to the end portion than to the central portion of the control trench gate $51$. A distance between the inversion layer formed in the vicinity of the central portion of the control trench gate $51$ and the contact hole $4b$ in FIG. $16$ is larger than in the configuration shown in FIG. $12$ or $15$. If the distance between the inversion layer and a contact region is large, the above-described instability becomes notable.

On the other hand, in the presence of the $n^+$-type source layer $53$, the additive capacitance ($C_{ge'}$) is not reduced but is stable even in a region where a voltage at the control trench electrode $51a$ is high. This is for the reason that the $n^+$-type source layer $53$ extends from the contact hole $4b$ to the central portion of the control trench gate $51$. Specifically, the $n^+$-type source layer $53$ connects the inversion layer and its vicinity at the central portion of the control trench gate $51$ and the contact region to each other to stabilize the additive capacitance ($C_{ge'}$).

First Modification of Second Preferred Embodiment

FIG. $18$ is a plan view showing the configuration of the capacitance adjusting region $50$ according to a first modification of the second preferred embodiment. Like FIG. $16$, FIG. $18$ shows a state in which the interlayer insulating film $4$, the barrier metal $5$, the emitter electrode $6$, the gate line $42$, and the control pad $41$ are seen through.

The control trench gates $51$ include a control trench gate $151$ and a control trench gate $251$.

The interlayer insulating film $4$ includes a contact hole $4c$ in addition to the contact holes $4a$ and $4b$. The contact hole $4a$ is provided on the control trench electrode $51a$ at an end portion of the control trench gate $151$. The contact hole $4c$ is provided between the control pad $41$ and the gate line $42$ and on the control trench electrode $51a$ of the control trench gate $251$. The control trench electrode $51a$ is exposed through the contact hole $4c$.

The control trench electrode $51a$ of the control trench gate $151$ is electrically connected through the contact hole $4a$ to the gate line $42$.

The control trench electrode $51a$ of the control trench gate $251$ is electrically connected through the contact hole $4c$ to the emitter electrode $6$ and is not connected to the gate line $42$.

Like in the second preferred embodiment, the p-type semiconductor layer $55$ and the $n^+$-type source layer $53$ are electrically connected through the contact hole $4b$ to the emitter electrode $6$.

In this configuration, the additive capacitance ($C_{ge'}$) in the capacitance adjusting region $50$ is adjusted by adjusting the number of control trench gates $51$ to be connected to the gate line $42$, namely, by changing the arrangement of the contact holes $4a$ and $4c$. The ratio between the input capacitance ($C_{ge}+C_{gc}$) and the feedback capacitance ($C_{gc}$) is optimized in response to various conditions of use to reduce switching loss in the semiconductor device $100$ or $101$.

Second Modification of Second Preferred Embodiment

FIG. $19$ is a plan view showing the configuration of the capacitance adjusting region $50$ according to a second modification of the second preferred embodiment. Like FIG. $16$, FIG. $19$ shows a state in which the interlayer insulating film $4$, the barrier metal $5$, the emitter electrode $6$, the gate line $42$, and the control pad $41$ are seen through.

The control trench gates $51$ include a first control trench gate $351$ and a second control trench gate $451$.

The gate line $42$ includes a first gate line pattern $142$ and a second gate line pattern $242$. The first gate line pattern $142$ and the second gate line pattern $242$ are metal patterns, for example.

The first gate line pattern $142$ is electrically connected through the contact hole $4a$ to the control trench electrode $51a$ of the first control trench gate $351$. In other words, the control trench electrode $51a$ of the first control trench gate $351$ is connected through the first gate line pattern $142$ to the gate trench electrode $11a$.

The second gate line pattern $242$ is electrically connected through the contact hole $4a$ to the control trench electrode $51a$ of the second control trench gate $451$. The second gate line pattern $242$ is disconnected. Thus, the control trench electrode $51a$ of the second control trench gate $451$ is insulated from the gate trench electrode $11a$ and the gate pad $41c$.

The second gate line pattern $242$ is formed by cutting the first gate line pattern $142$ with laser, for example. During the laser cutting, the upper surface of the first gate line pattern $142$ is preferably exposed. A side surface of a disconnected part of the second gate line pattern $242$ includes a surface with irregularities randomly generated as marks resulting from the laser cutting, for example. The irregularities at the side surface of the disconnected part of the second gate line pattern 242 are greater than irregularities at a side surface of the second gate line pattern 242 at a part except the disconnected part.

As a result of formation of the second gate line pattern 242, specifically, as a result of cutting of the first gate line pattern 142, the additive capacitance ($C_{ge'}$) is adjusted. In other words, this configuration allows adjustment of the additive capacitance ($C_{ge'}$) after formation of the chip of the semiconductor device 100 or 101 is finished. The ratio between the input capacitance ($C_{ge}+C_{gc}$) and the feedback capacitance ($C_{gc}$) is optimized in response to various conditions of use to reduce switching loss in the semiconductor device 100 or 101.

Third Preferred Embodiment

A semiconductor device according to a third preferred embodiment will be described. In the third preferred embodiment, a constituting element corresponding to that of the first or second preferred embodiment is given the same reference sign and will not be described in detail.

FIG. 20 is a plan view showing the configuration of the capacitance adjusting region 50 in the semiconductor device 100 or 101 according to the third preferred embodiment. FIG. 20 shows a state in which the interlayer insulating film 4, the barrier metal 5, the emitter electrode 6, and the gate line 42 are seen through.

FIG. 21 is a sectional view showing the configuration of the capacitance adjusting region 50 in the semiconductor device 100 or 101 according to the third preferred embodiment. FIG. 21 shows a section taken along a line segment J-J in FIG. 20. FIG. 21 shows the configuration of one capacitance adjusting cell. While only one control trench gate 51 is shown in this capacitance adjusting cell, the semiconductor device 100 or 101 includes the control trench gates 51 like in the first or second preferred embodiment.

In the capacitance adjusting region 50, the semiconductor device 100 and the semiconductor device 101 each include the p-type semiconductor layer 55, the n⁻-type drift layer 1, the n-type buffer layer 3, the p-type collector layer 16, the control trench gate 51, the interlayer insulating film 4, the barrier metal 5, the emitter electrode 6, and the collector electrode 7.

The p-type semiconductor layer 55 is selectively provided as a surface layer at the upper surface of the semiconductor substrate. The p-type semiconductor layer 55 is electrically connected to the emitter electrode 6.

The n⁻-type drift layer 1 is provided between the p-type semiconductor layer 55 and the lower surface of the semiconductor substrate. The n⁻-type drift layer 1 has a configuration similar to that of the n⁻-type drift layer 1 in the IGBT region 10. In the third preferred embodiment, however, the n⁻-type drift layer 1 is exposed through a region in the absence of the p-type semiconductor layer 55. Specifically, the n⁻-type drift layer 1 is exposed as a surface layer of the semiconductor substrate through a region between a plurality of regions in the presence of the p-type semiconductor layer 55.

The n-type buffer layer 3 and the p-type collector layer 16 in the capacitance adjusting region 50 have configurations similar to those of the n-type buffer layer 3 and the p-type collector layer 16 in the IGBT region 10 respectively.

The control trench gate 51 is provided in the n⁻-type drift layer 1 sandwiched between two regions of the p-type semiconductor layer 55. However, in a direction in which the control trench gate 51 extends, the control trench gate 51 is not required to be formed entirely in the n⁻-type drift layer 1. As shown in FIG. 20, in the direction in which the control trench gate 51 extends, the control trench gate 51 may have a part contacting the p-type semiconductor layer 55 and a part not contacting the p-type semiconductor layer 55. Specifically, the control trench gate 51 may only be required to be formed at least partially in the n⁻-type drift layer 1 sandwiched between the p-type semiconductor layers 55.

A tip of the control trench gate 51 is located in the n⁻-type drift layer 1. In other words, the control trench electrode 51a has a bottom facing the n⁻-type drift layer 1 across the control trench insulating film 51b. A depth from the first main surface of the semiconductor substrate to the lower surface of the p-type semiconductor layer 55 is greater than a depth from the first main surface of the semiconductor substrate to the bottom of the control trench electrode 51a. The lower surface of the p-type semiconductor layer 55 corresponds to a surface of bonding between the p-type semiconductor layer 55 and the n⁻-type drift layer 1, for example.

The interlayer insulating film 4 covers the upper surface of the control trench gate 51 and the upper surface of the n⁻-type drift layer 1. The interlayer insulating film 4 includes a plurality of contact holes 4a and 4b. The control trench electrode 51a is exposed through the contact hole 4a. The p-type semiconductor layer 55 is exposed through the contact hole 4b.

The gate line 42 is electrically connected through the contact hole 4a to the control trench electrode 51a. The control trench electrode 51a is electrically connected through the gate line 42 to the gate trench electrode 11a in the IGBT region 10. The control trench electrode 51a is further electrically connected through the gate line 42, for example, to the gate pad 41c.

The emitter electrode 6 extends from the IGBT region 10 into the capacitance adjusting region 50. Specifically, the emitter electrode 6 in the capacitance adjusting region 50 ohmically contacts the p-type semiconductor layer 55 through the contact hole 4b.

Not all the control trench electrodes 51a in the capacitance adjusting region 50 are required to be connected to the gate line 42 but at least one control trench electrode 51a may electrically be connected to the gate line 42.

In the above-described configuration, a capacitance is formed between the control trench electrode 51a and the p-type semiconductor layer 55 at the bottom of the control trench gate 51 and this capacitance functions as an additive capacitance ($C_{gc'}$) between the gate and the collector. The configuration shown in FIG. 18 or 19 is further applicable to the semiconductor device 100 or 101 according to the third preferred embodiment. This realizes adjustment of the number of the control trench gates 51 to be electrically connected to the gate trench electrode 11a. The semiconductor device 100 or 101 allows optimization of the ratio between the input capacitance ($C_{ge}+C_{gc}$) and the feedback capacitance ($C_{gc}$) without changing the configuration of the IGBT region 10 to reduce switching loss.

As the control trench gate 51 is sandwiched between the p-type semiconductor layers 55 across the n⁻-type drift layer 1, a breakdown voltage is still retained even in a state where a voltage is applied between the emitter and the collector.

In the third preferred embodiment, a pitch of the control trench gates 51 may also be narrower than a pitch of the active trench gates 11. The control trench insulating film 51b may be thinner than the gate trench insulating film 11b. The control trench gate 51 may be deeper than the active trench gate 11.

First Modification of Third Preferred Embodiment

FIG. 22 is a plan view showing the configuration of the capacitance adjusting region 50 according to a first modification of the third preferred embodiment. The control trench gate 51 may extend in one direction while passing directly under the control pad 41. The control trench electrode 51a is electrically connected through the contact hole 4a to the gate line 42 only at an end portion of the control trench gate 51. The p-type semiconductor layer 55 is electrically connected through the contact hole 4b to the emitter electrode 6 only in a region between the control pad 41 and the gate line 42.

Second Modification of Third Preferred Embodiment

FIG. 23 is a plan view showing the configuration of the capacitance adjusting region 50 according to a second modification of the third preferred embodiment. The control trench gates 51 include a control trench gate 151 connected to the gate line 42 and a control trench gate 251 not connected to the gate line 42. The control trench electrode 51a of the control trench gate 251 is electrically connected through the contact hole 4c to the emitter electrode 6.

Third Modification of Third Preferred Embodiment

FIG. 24 is a plan view showing the configuration of the capacitance adjusting region 50 according to a third modification of the third preferred embodiment. The first gate line pattern 142 is electrically connected to the control trench electrode 51a of the first control trench gate 351 at an end portion of the first control trench gate 351. The second gate line pattern 242 is electrically connected to the control trench electrode 51a of the second control trench gate 451 at an end portion of the second control trench gate 451. The second gate line pattern 242 is disconnected.

As described above, the arrangement of the control trench gate 51 and arrangement of the contact holes 4a, 4b, and 4c in the third preferred embodiment may be similar to those in any of the first preferred embodiment, the second preferred embodiment, and the modifications of each of these preferred embodiments.

The present disclosure can be combined freely, and each preferred embodiment can be modified or omitted, where appropriate, within the range of the disclosure.

While the disclosure has been shown and described in detail, the foregoing description is in all aspects illustrative and not restrictive. It is therefore understood that numerous modifications and variations can be devised.

What is claimed is:

1. A semiconductor device comprising:
a semiconductor substrate;
a transistor region provided in the semiconductor substrate and including a transistor; and
a capacitance adjusting region provided in the semiconductor substrate, the capacitance adjusting region including:
a first semiconductor layer of a first conductivity type provided as a surface layer at an upper surface of the semiconductor substrate in the capacitance adjusting region;
a second semiconductor layer of a second conductivity type as the surface layer of the semiconductor substrate in the capacitance adjusting region, the second semiconductor layer being selectively provided at an upper surface of the first semiconductor layer;
a drift layer of the second conductivity type in the capacitance adjusting region;
a collector layer of the first conductivity type in the capacitance adjusting region, the collector layer being provided below the drift layer; and
a plurality of control trench gates each including: a control trench insulating film formed on an inner wall of a control trench penetrating the second semiconductor layer from the upper surface of the semiconductor substrate, and having a tip located in the first semiconductor layer; and a control trench electrode formed inside the control trench across the control trench insulating film, wherein
the second semiconductor layer contacts a side surface of each of the control trench gates,
the first semiconductor layer and the second semiconductor layer are electrically connected to an emitter electrode of the transistor,
the control trench electrode of at least one control trench gate of the control trench gates is electrically connected to a gate electrode of the transistor.

2. The semiconductor device according to claim 1, wherein
the transistor region includes:
the drift layer of the second conductivity type provided between the upper surface and a lower surface of the semiconductor substrate in the transistor region;
a base layer of the first conductivity type provided over the drift layer;
a source layer of the second conductivity type as the surface layer at the upper surface of the semiconductor substrate in the transistor region, the source layer being selectively provided over the base layer;
a plurality of trench gates each including: a gate trench insulating film formed on an inner wall of a gate trench penetrating the source layer and the base layer from the upper surface of the semiconductor substrate, and having a tip located in the drift layer; and the gate electrode of the transistor formed inside the gate trench across the gate trench insulating film; and
the emitter electrode electrically connected to the source layer and insulated from the gate electrode of the transistor, wherein
the gate electrode of the transistor within at least one trench gate of the trench gates is electrically connected to the control trench electrode of the at least one control trench gate.

3. The semiconductor device according to claim 2, wherein
a pitch of the control trench gates is narrower than a pitch of the trench gates.

4. The semiconductor device according to claim 2, wherein
the control trench gates each have a depth from the upper surface of the semiconductor substrate greater than that of each of the trench gates from the upper surface of the semiconductor substrate.

5. The semiconductor device according to claim 1, further comprising:
a signal pad for detecting or controlling a state of the semiconductor substrate; and
a gate line electrically connecting the control trench electrode in the capacitance adjusting region and the gate electrode in the transistor region to each other, wherein the emitter electrode extends from the transistor region into the capacitance adjusting region and is arranged between the signal pad and the gate line in a plan view, the control trench gates extend in one direction at the upper surface of the semiconductor substrate while passing directly under the signal pad, an end portion of each of the control trench gates is covered with the gate line, the control trench electrode is electrically connected to the gate line only at the end portion of the at least one control trench gate, and the first semiconductor layer is electrically connected to the emitter electrode only in a region between the signal pad and the gate line.

6. The semiconductor device according to claim 5, wherein the control trench gates include a control trench gate not connected to the gate line, and the control trench electrode of the control trench gate not connected to the gate line is electrically connected to the emitter electrode in the region between the signal pad and the gate line.

7. The semiconductor device according to claim 2, wherein the control trench insulating film is thinner than the gate trench insulating film.

8. The semiconductor device according to claim 5, wherein the control trench gates include a first control trench gate and a second control trench gate, the gate line includes:

a first gate line pattern electrically connected to the control trench electrode of the first control trench gate at the end portion of the first control trench gate; and a second gate line pattern electrically connected to the control trench electrode of the second control trench gate at the end portion of the second control trench gate, and the second gate line pattern is disconnected.

9. The semiconductor device according to claim 1, wherein the first semiconductor layer is the first conductivity type continuously from the upper surface of the semiconductor substrate to the tip of the control trench gates such that a concentration of dopants of the first conductivity type in the first semiconductor layer is greater than a concentration of dopants of the second conductivity type continuously from the upper surface of the semiconductor substrate to the tip of the control trench gates.

10. The semiconductor device according to claim 1, wherein the transistor region includes:

the drift layer of the second conductivity type provided between the upper surface and a lower surface of the semiconductor substrate; and a base layer of the first conductivity type provided over the drift layer, and the first semiconductor layer is the first conductivity type continuously from the upper surface of the semiconductor substrate to the tip of the control trench gates such that a concentration of dopants of the first conductivity type in the first semiconductor layer is greater than a concentration of dopants of the second conductivity type continuously from the upper surface of the semiconductor substrate to the tip of the control trench gates.

11. The semiconductor device according to claim 1, wherein the drift layer is spaced from a lower surface of the semiconductor substrate.

* * * * *